(12) United States Patent
Suzuki et al.

(10) Patent No.: US 12,205,892 B2
(45) Date of Patent: Jan. 21, 2025

(54) SEMICONDUCTOR DEVICE

(71) Applicant: SEMICONDUCTOR ENERGY LABORATORY CO., LTD., Atsugi (JP)

(72) Inventors: Akio Suzuki, Kanagawa (JP); Atsushi Miyaguchi, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 528 days.

(21) Appl. No.: 17/297,863

(22) PCT Filed: Nov. 20, 2019

(86) PCT No.: PCT/IB2019/059960
§ 371 (c)(1),
(2) Date: May 27, 2021

(87) PCT Pub. No.: WO2020/136470
PCT Pub. Date: Jul. 2, 2020

(65) Prior Publication Data
US 2022/0020683 A1    Jan. 20, 2022

(30) Foreign Application Priority Data
Dec. 27, 2018    (JP) .................................. 2018-243859

(51) Int. Cl.
*H01L 23/528*    (2006.01)
*H01L 23/31*    (2006.01)
(Continued)

(52) U.S. Cl.
CPC ........ *H01L 23/528* (2013.01); *H01L 23/3107* (2013.01); *H01L 23/3672* (2013.01); *H01L 29/78648* (2013.01); *H01L 29/7869* (2013.01)

(58) Field of Classification Search
CPC . H01L 23/34–38; H01L 23/498–49894; H01L 29/7869–78693
See application file for complete search history.

(56) References Cited

U.S. PATENT DOCUMENTS 6,121,659 A    9/2000  Christensen et al.
7,378,747 B2   5/2008  Kim
(Continued)

FOREIGN PATENT DOCUMENTS

CN    001862796 A    11/2006
EP     0948054 A     10/1999
(Continued)

OTHER PUBLICATIONS

International Search Report (Application No. PCT/IB2019/059960) Dated Feb. 18, 2020.
(Continued)

*Primary Examiner* — Daniel P Shook
(74) *Attorney, Agent, or Firm* — NIXON PEABODY LLP; Jeffrey L. Costellia

(57) ABSTRACT

A semiconductor device having a novel structure is provided. The semiconductor device includes a silicon substrate and a device provided above the silicon substrate. The device includes a transistor and a conductor. The transistor includes a metal oxide in a channel formation region. Conductivity is imparted to the silicon substrate. The conductor is electrically connected to each of a drain of the transistor and the silicon substrate through an opening provided in the device. Heat of the drain of the transistor can be efficiently released through the silicon substrate.

10 Claims, 14 Drawing Sheets

(51) Int. Cl.
  *H01L 23/367* (2006.01)
  *H01L 29/786* (2006.01)

(56) References Cited

U.S. PATENT DOCUMENTS

| | | |
|---|---|---|
| 8,421,068 B2 | 4/2013 | Yamazaki et al. |
| 8,803,206 B1 | 8/2014 | Or-Bach et al. |
| 9,281,237 B2 | 3/2016 | Yamazaki |
| 9,385,058 B1 | 7/2016 | Or-Bach et al. |
| 9,460,978 B1 | 10/2016 | Or-Bach et al. |
| 9,460,991 B1 | 10/2016 | Or-Bach et al. |
| 9,553,202 B2 | 1/2017 | Kurata et al. |
| 9,666,678 B2 | 5/2017 | Yamazaki et al. |
| 9,674,470 B2 | 6/2017 | Kurokawa et al. |
| 9,685,500 B2 | 6/2017 | Yamazaki et al. |
| 9,911,627 B1 | 3/2018 | Or-Bach et al. |
| 9,917,207 B2 | 3/2018 | Yamazaki |
| 9,923,001 B2 | 3/2018 | Yamazaki |
| 9,929,276 B2 | 3/2018 | Yamazaki |
| 9,947,700 B2 | 4/2018 | Yamazaki et al. |
| 10,020,336 B2 | 7/2018 | Ikeda et al. |
| 10,074,747 B2 | 9/2018 | Yamazaki et al. |
| 10,236,357 B2 | 3/2019 | Yamane et al. |
| 10,333,004 B2 | 6/2019 | Kimura et al. |
| 10,522,688 B2 | 12/2019 | Kato et al. |
| 10,658,389 B2 | 5/2020 | Kurata et al. |
| 10,777,682 B2 | 9/2020 | Yamazaki et al. |
| 11,031,506 B2 | 6/2021 | Yamazaki et al. |
| 11,074,962 B2 | 7/2021 | Onuki et al. |
| 11,837,461 B2 | 12/2023 | Yamazaki et al. |
| 2006/0255468 A1 | 11/2006 | Kim |
| 2011/0057254 A1 | 3/2011 | Tsen et al. |
| 2011/0254523 A1 | 10/2011 | Ito et al. |
| 2014/0102877 A1 | 4/2014 | Yamazaki |
| 2015/0255367 A1* | 9/2015 | Nakahara ............ H01L 23/4006 |
| | | 438/122 |
| 2015/0349127 A1* | 12/2015 | Kurata ............. H01L 29/66969 |
| | | 257/43 |
| 2017/0098599 A1* | 4/2017 | Zhou .................. H01L 27/1218 |
| 2020/0321360 A1 | 10/2020 | Kurata et al. |
| 2021/0126130 A1 | 4/2021 | Yamazaki et al. |
| 2021/0233769 A1 | 7/2021 | Yamazaki et al. |

FOREIGN PATENT DOCUMENTS

| | | |
|---|---|---|
| JP | 11-330489 A | 11/1999 |
| JP | 2006-319338 A | 11/2006 |
| JP | 2011-103458 A | 5/2011 |
| JP | 2013-089613 A | 5/2013 |
| JP | 2016-006855 A | 1/2016 |
| JP | 2016-162913 A | 9/2016 |
| KR | 10-0644028 | 11/2006 |
| KR | 2017-0015292 A | 2/2017 |
| TW | 200644207 | 12/2006 |
| TW | 201545351 | 12/2015 |
| WO | WO-2011/046048 | 4/2011 |
| WO | WO-2015/182000 | 12/2015 |
| WO | WO-2017/125795 | 7/2017 |

OTHER PUBLICATIONS

Written Opinion (Application No. PCT/IB2019/059960) Dated Feb. 18, 2020.

Kunitake.H et al., "High thermal tolerance of 25-nm c-axis aligned crystalline In—Ga—Zn oxide FET", IEDM 18: Technical Digest of International Electron Devices Meeting, Dec. 1, 2018, pp. 312-315.

Takahashi.T et al., "Comparison of Self-Heating Effect (SHE) in Short-Channel Bulk and Ultra-Thin BOX SOI MOSFETs: Impacts of Doped Well, Ambient Temperature, and SOI/BOX Thicknesses on SHE", IEDM 13: Technical Digest of International Electron Devices Meeting, Dec. 9, 2013, pp. 184-187.

* cited by examiner

SEMICONDUCTOR DEVICE

TECHNICAL FIELD

One embodiment of the present invention relates to a semiconductor device.

BACKGROUND ART

A metal oxide exhibiting semiconductor characteristics, which is called an oxide semiconductor has attracted attention as a novel semiconductor. Development of transistors using oxide semiconductors is being pursued. For example, the structure of a DC-DC converter in which the transistors using oxide semiconductors can be used as power transistors is disclosed in Patent Document 1 below.

REFERENCE

Patent Document

[Patent Document 1] United States Patent Application Publication No. 2011/0254523

SUMMARY OF THE INVENTION

Problems to be Solved by the Invention

An oxide semiconductor such as an In—Ga—Zn-based oxide (also referred to as IGZO) has a thermal conductivity of approximately $1/100$ of that of an insulating layer of silicon oxide or the like. Therefore, self-generated heat caused when a high current flows between a source and a drain of a transistor in operation of the transistor is likely to be accumulated. The self-generated heat causes the variation in electrical characteristics or the element degradation of the transistor, which might reduce reliability.

An object of one embodiment of the present invention is to provide a semiconductor device or the like having a novel structure. Another object of one embodiment of the present invention is to provide a highly reliable semiconductor device having a novel structure, or the like. Another object of one embodiment of the present invention is to provide a semiconductor device or the like having a novel structure that allows reducing of the influence of self-generated heat on the variation in electrical characteristics or the element degradation of the transistor.

Note that the objects of one embodiment of the present invention are not limited to the objects listed above. The objects listed above do not preclude the existence of other objects. Note that the other objects are objects that are not described in this section and will be described below. The objects that are not described in this section will be derived from the descriptions of the specification, the drawings, and the like and can be extracted from these descriptions by those skilled in the art. Note that one embodiment of the present invention is to solve at least one of the description listed above and/or the other objects.

Means for Solving the Problems

One embodiment of the present invention is a semiconductor device including a silicon substrate and a device provided above the silicon substrate, in which the device includes a transistor and a conductor, the transistor includes a metal oxide in a channel formation region, conductivity is imparted to the silicon substrate, and the conductor is electrically connected to each of a drain of the transistor and the silicon substrate through an opening provided in the device.

One embodiment of the present invention is a semiconductor device including a silicon substrate, a device provided above the silicon substrate, a first extraction electrode, and a second extraction electrode, in which the device includes a transistor and a conductor, the transistor includes a metal oxide in a channel formation region, conductivity is imparted to the silicon substrate, the conductor is electrically connected to each of a drain of the transistor and the silicon substrate through an opening provided in the device, the first extraction electrode is electrically connected to the conductor connected to a source of the transistor, and the second extraction electrode is electrically connected to the silicon substrate.

In the semiconductor device of one embodiment of the present invention, it is preferable that the first extraction electrode be electrically connected to, through a metal wiring, the conductor connected to the source of the transistor.

In the semiconductor device of one embodiment of the present invention, it is preferable that the second extraction electrode be directly connected to the silicon substrate.

In the semiconductor device of one embodiment of the present invention, it is preferable that p-type conductivity be imparted to the silicon substrate.

In the semiconductor device of one embodiment of the present invention, it is preferable that the silicon substrate and the device be covered with a resin layer and the resin layer be provided in a housing.

In the semiconductor device of one embodiment of the present invention, it is preferable that the silicon substrate be provided with a heat sink with an insulating layer therebetween.

Note that other embodiments of the present invention are shown in the description of the following embodiments and the drawings.

Effect of the Invention

One embodiment of the present invention can provide a semiconductor device or the like having a novel structure. Another embodiment of the present invention can provide a highly reliable semiconductor device or the like having a novel structure. Another embodiment of the present invention can provide a semiconductor device or the like having a novel structure that allows reducing of the influence of self-generated heat on the variation in electrical characteristics or the element degradation of the transistor.

Note that the effects of one embodiment of the present invention are not limited to the effects listed above. The effects listed above do not preclude the existence of other effects. Note that the other effects are effects that are not described in this section and will be described below. The effects that are not described in this section will be derived from the descriptions of the specification, the drawings, and the like and can be extracted from these descriptions by those skilled in the art. Note that one embodiment of the present invention is to have at least one of the effects listed above and/or the other effects. Accordingly, depending on the case, one embodiment of the present invention does not have the effects listed above in some cases.

MODE FOR CARRYING OUT THE INVENTION

Figure 1A:
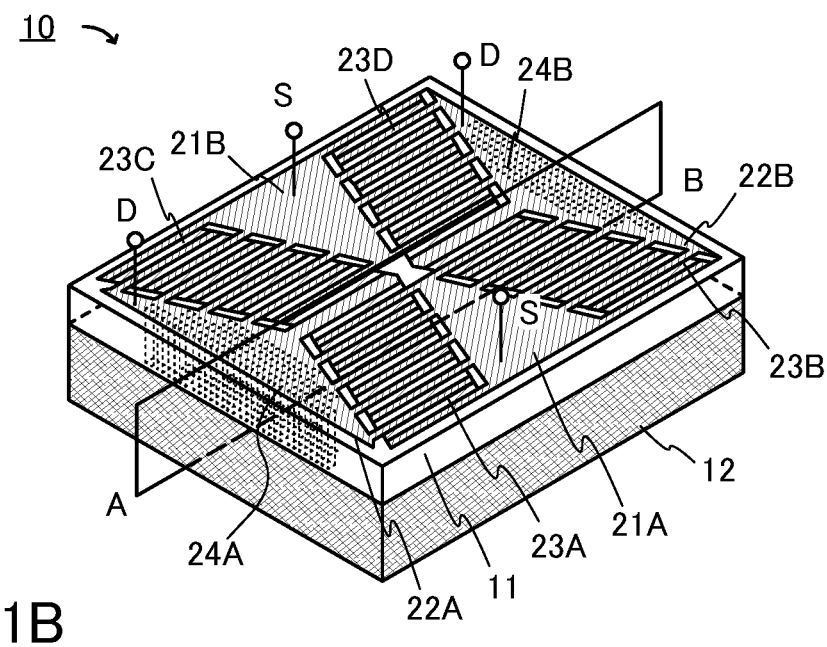
FIG. 1A and FIG. 1B are a perspective view and a schematic cross-sectional view illustrating one embodiment of the present invention.

Embodiments of the present invention will be described below. Note that one embodiment of the present invention is not limited to the following description, and it will be readily appreciated by those skilled in the art that modes and details of the present invention can be modified in various ways without departing from the spirit and scope of the present invention. One embodiment of the present invention therefore should not be construed as being limited to the following description of the embodiments.

Note that ordinal numbers such as "first", "second", and "third" in this specification and the like are used in order to avoid confusion among components. Thus, the terms do not limit the number of components. In addition, the terms do not limit the order of components. Furthermore, in this specification and the like, for example, a "first" component in one embodiment can be referred to as a "second" component in other embodiments or claims. Furthermore, in this specification and the like, for example, a "first" component in one embodiment can be omitted in other embodiments or claims.

The same components, components having similar functions, components made of the same material, components formed at the same time, and the like in the drawings are denoted by the same reference numerals, and repetitive description thereof is skipped in some cases.

In this specification, a power supply potential VDD may be abbreviated to a potential VDD, VDD, or the like, for example. The same applies to other components (e.g., a signal, a voltage, a circuit, an element, an electrode, a wiring, and the like).

Moreover, when a plurality of components are denoted by the same reference numerals, and, in particular, need to be distinguished from each other, an identification sign such as "_1", "_2", "[n]", or "[m,n]" is sometimes added to the reference numerals. For example, the second wiring GL is referred to as a wiring GL[2].

Embodiment 1

Structure examples of a semiconductor device of one embodiment of the present invention are described with reference to FIG. 1 to FIG. 9.

Note that the semiconductor device in this embodiment is a device including a power transistor (also referred to as a power semiconductor) designed so that a high current flows to a load. The power transistor refers to a transistor that has a large voltage to be applied, a large amount of current flowing between an electrode connected to a source and an electrode connected to a drain, and much higher power than that used in a display device, a logic circuit, or the like.

FIG. 1A illustrates a perspective view of a semiconductor device 10 having a structure in which a device 11 (sometimes referred to as an element layer) is provided over a silicon substrate 12. The device 11 includes a plurality of transistors 23A to 23D, conductors 21A and 21B, and conductors 22A and 22B. Furthermore, the device 11 includes a plurality of openings 24A and 24B reaching the silicon substrate 12.

The conductors 21A and 21B function as electrodes connected to sources of the transistors 23A to 23D. In the diagram, the conductors 21A and 21B are illustrated with "S" representing the source side. Note that in the structure shown in FIG. 1A, the number of electrodes connected to the sources is two but may be one or three or more.

The conductors 22A and 22B function as electrodes connected to drains of the transistors 23A to 23D. In the diagram, the conductors 22A and 22B are illustrated with "D" representing the drain side. Note that in the structure shown in FIG. 1A, the number of electrodes connected to the drains is two but may be one or three or more.

Although not illustrated in FIG. 1A, the transistors 23A to 23D each include a gate, a channel formation region, and regions functioning as a drain and a source. The transistor 23A is a transistor provided between the conductor 21A connected to the source and the conductor 22A connected to the drain. The transistor 23B is a transistor provided between the conductor 21A connected to the source and the conductor 22B connected to the drain. The transistor 23C is a transistor provided between the conductor 21B connected to the source and the conductor 22A connected to the drain. The transistor 23D is a transistor provided between the conductor 21B connected to the source and the conductor 22B connected to the drain.

The transistors 23A to 23D are provided so that the sources and the drains of the plurality of transistors are arranged in parallel between the conductors 21A and 21B and the conductors 22A and 22B. The plurality of transistors provided in parallel enable a high current to flow between the conductors 21A and 21B and the conductors 22A and 22B. Moreover, miniaturized transistors in each of which the length in the channel length direction is less than or equal to 1 μm can be used as the transistors 23A to 23D, and thus variation in transistor characteristics can be reduced.

Each of the transistors 23A to 23D is a transistor in which a semiconductor layer including a channel formation region is formed of an oxide semiconductor (referred to as an OS transistor). Note that an oxide semiconductor is referred to as a metal oxide or an oxide in some cases. Description is made on the assumption that the OS transistor is an n-channel transistor unless otherwise specified. The oxide semiconductor, when having a low carrier concentration, can significantly reduce the current flowing between the source and the drain in an off state (also referred to as off-state current or leakage current). The details of an OS transistor are described later.

An OS transistor can freely be placed by being stacked over a silicon substrate or the like, which facilitates integration. The OS transistor can be fabricated at low cost because it can be fabricated using a manufacturing apparatus similar to that for a transistor (Si transistor) in which a semiconductor layer including a channel formation region is formed of silicon.

In addition, when an OS transistor has a back gate electrode in addition to a gate electrode, a source electrode, and a drain electrode, the OS transistor can be a four-terminal semiconductor element. The OS transistor can be formed with an electric circuit network that can independently control input and output of signals flowing between a source and a drain depending on a voltage supplied to the gate electrode or the back gate electrode. Thus, circuit design with the same ideas as those of an LSI is possible. Furthermore, electrical characteristics of the OS transistor are better than those of a Si transistor in a high-temperature environment. Specifically, the ratio between on-state current and off-state current is large even at a high temperature higher than or equal to 100° C. and lower than or equal to 200° C., preferably higher than or equal to 125° C. and lower than or equal to 150° C.; thus, favorable switching operation can be performed.

The silicon substrate 12 is a silicon substrate to which conductivity is imparted. The silicon substrate 12 is a silicon substrate into which an impurity element for imparting n-type or p-type conductivity is introduced. The silicon substrate 12 to which p-type conductivity is imparted can have higher thermal conductivity than a silicon substrate to which n-type conductivity is imparted. The silicon substrate 12 may include a transistor for forming a logic circuit.

Conductors are provided in the openings 24A and 24B, whereby the conductors 22A and 22B and the silicon substrate 12 are connected. In other words, the drains of the transistors 23A to 23D are connected to the silicon substrate 12 through the conductors 22A and 22B and the conductors provided in the openings 24A and 24B. Note that the connection between the drains of the transistors 23A to 23D and the silicon substrate 12 may be established through the conductors 22A and 22B or may be established by direct connection through the conductors provided in the openings 24A and 24B.

With the structure of the semiconductor device 10 having the structure of FIG. 1A, heat generated on the drain side by a current flowing through the transistors 23A to 23D which are OS transistors can be released to the silicon substrate 12 through the conductors in the openings provided in the device 11. Therefore, the variation in electrical characteristics or the element degradation of the transistors 23A to 23D due to heat generation can be inhibited, so that the semiconductor device 10 can have high reliability.

Figure 1B:
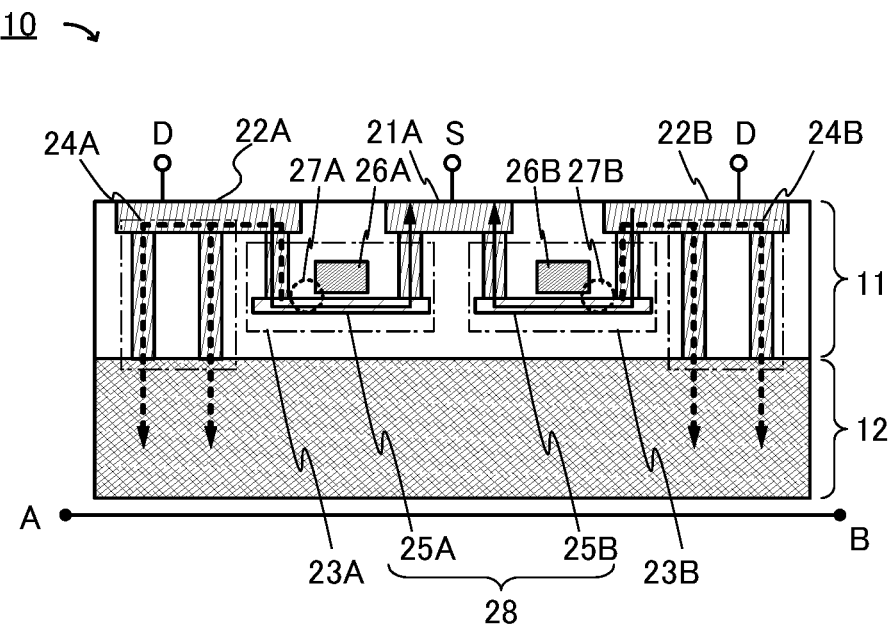

FIG. 1B illustrates a schematic cross-sectional view of the semiconductor device 10 along a cut surface A-B in FIG. 1A. In the schematic cross-sectional view shown in FIG. 1B, the device 11 is provided over the silicon substrate 12 as in FIG. 1A. The device 11 is provided with the transistors 23A and 23B. The transistor 23A includes a gate electrode 26A and an oxide layer 25A that functions as a semiconductor layer. The transistor 23B includes a gate electrode 26B and an oxide layer 25B that functions as a semiconductor layer.

Note that the oxide layer 25A and the oxide layer 25B are denoted by an oxide layer 28 in other drawings in some cases.

In the transistor 23A, the oxide layer 25A is connected to the conductor 21A. The oxide layer 25A is connected to the conductor 22A. A current flowing through the transistor 23A flows from the drain (D) side to the source (S) side (illustrated by a thin line arrow in the drawing). Thus, in a region 27A of the oxide layer 25A on the drain side, electrons are accelerated to cause self-generated heat. Heat generated in the region 27A is released to the silicon substrate 12 side through the conductor 22A and the conductors provided in the opening 24A (illustrated by a thick dotted line arrow in the diagram).

In the transistor 23B, the oxide layer 25B is connected to the conductor 21A. The oxide layer 25B is connected to the conductor 22B. A current flowing through the transistor 23B flows from the drain (D) side to the source (S) side (illustrated by a thin line arrow in the drawing). Thus, in a region 27B of the oxide layer 25B on the drain side, electrons are accelerated to cause self-generated heat. Heat generated in the region 27B is released to the silicon substrate 12 side through the conductor 22B and the conductors provided in the opening 24B (illustrated by a thick dotted line arrow in the diagram).

Note that the transistors 23C and 23D have a structure similar to that of the transistors 23A and 23B. Accordingly, heat generated on the drain sides of the transistors can be released to the silicon substrate 12 through the conductors 22A and 22B and the conductors provided in the openings 24A and 24B.

As described with reference to FIG. 1A and FIG. 1B, in the structure of the semiconductor device of one embodiment of the present invention, the silicon substrate and the OS transistor are provided to be stacked, and heat generated on the drain side of the transistor is released to the silicon substrate side through the conductors provided in the opening. The silicon substrate can function as a heat sink. The variation in electrical characteristics or the element degradation of the transistor due to heat generation can be inhibited, so that the semiconductor device can have high reliability.

Figure 2A:
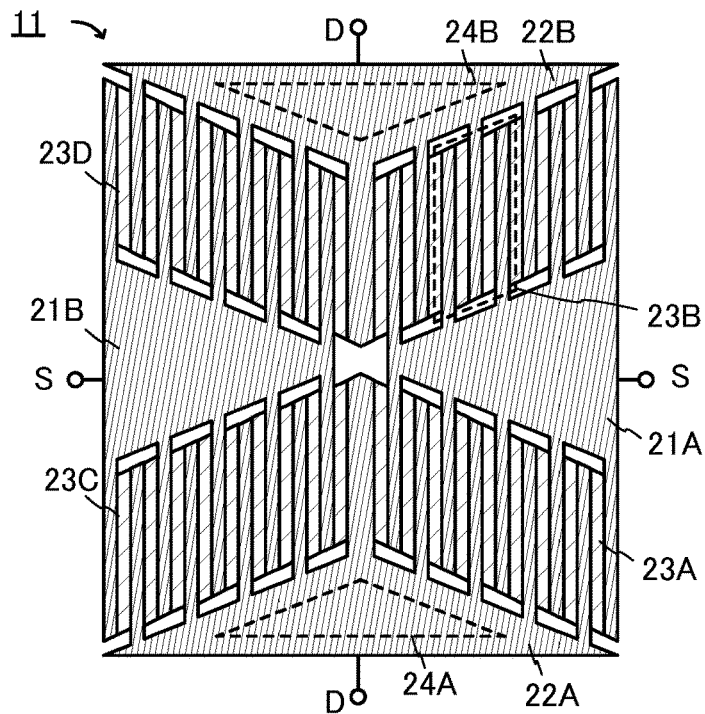
FIG. 2A, FIG. 2B, and FIG. 2C are top views for explaining one embodiment of the present invention.

Next, FIG. 2A illustrates a top view for explaining the structure of the device 11 described with reference to FIG. 1A and FIG. 1B. In the top view of FIG. 2A, the transistors 23A to 23D for controlling electrical connection between the conductors 21A and 21B and the conductors 22A and 22B are illustrated as an X-shaped region. The openings 24A and 24B where the conductors for connecting the drains of the transistors 23A to 23D and the silicon substrate 12 (not illustrated) are provided can be provided in regions overlapping with the conductors 22A and 22B. Note that the conductors 21A and 21B and the conductors 22A and 22B illustrated in the top layout diagram can function as electrodes to which external connection wirings are connected.

Note that the shapes of the conductors 21A and 21B and the conductors 22A and 22B functioning as electrodes when seen from above are preferably such that the distances between the external connection wirings and the transistors are equal to each other. Preferred examples include a circular shape or a triangular shape as illustrated in FIG. 2A. This structure can achieve uniform wiring resistances between the plurality of transistors and the wirings connected to the conductors 21A and 21B and the conductors 22A and 22B by wire bonding or the like.

Figure 2B:
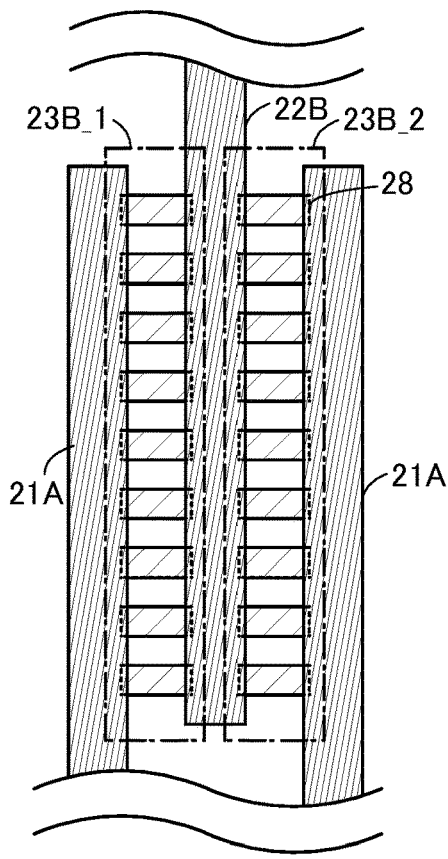

FIG. 2B shows an enlarged top view corresponding to a region where the transistor 23B illustrated in FIG. 2A is provided. In FIG. 2B, a plurality of island-shaped oxide layers 28 are provided between comb-shaped electrodes provided extending from the conductor 21A and the conductor 22B. The transistor 23B illustrated in FIG. 2A can be expressed as transistors 23B_1 and 23B_2 provided at both ends of the conductor 22B.

Figure 2C:
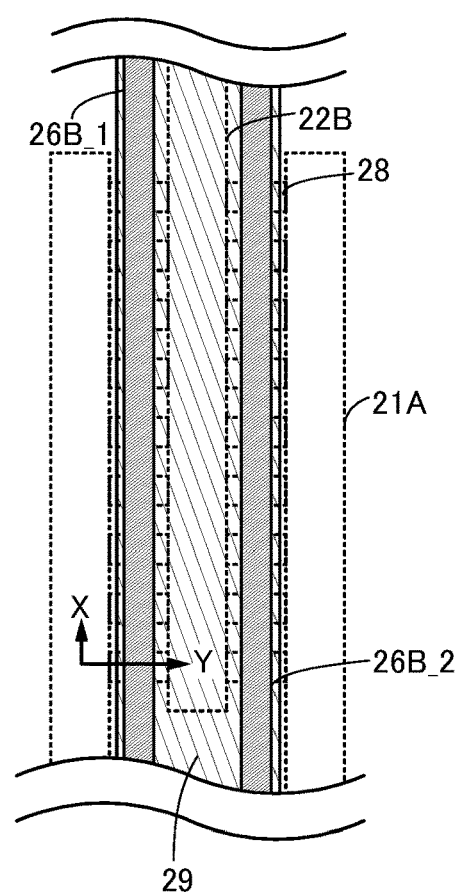

In FIG. 2C, the electrodes expressed as the conductor 21A and the conductor 22B are illustrated by a dotted line. FIG. 2C illustrates conductors 26B_1 and 26B_2 functioning as gate electrodes and a conductor 29 functioning as a back gate electrode, which overlap with the island-shaped oxide layers 28.

Figure 3A:
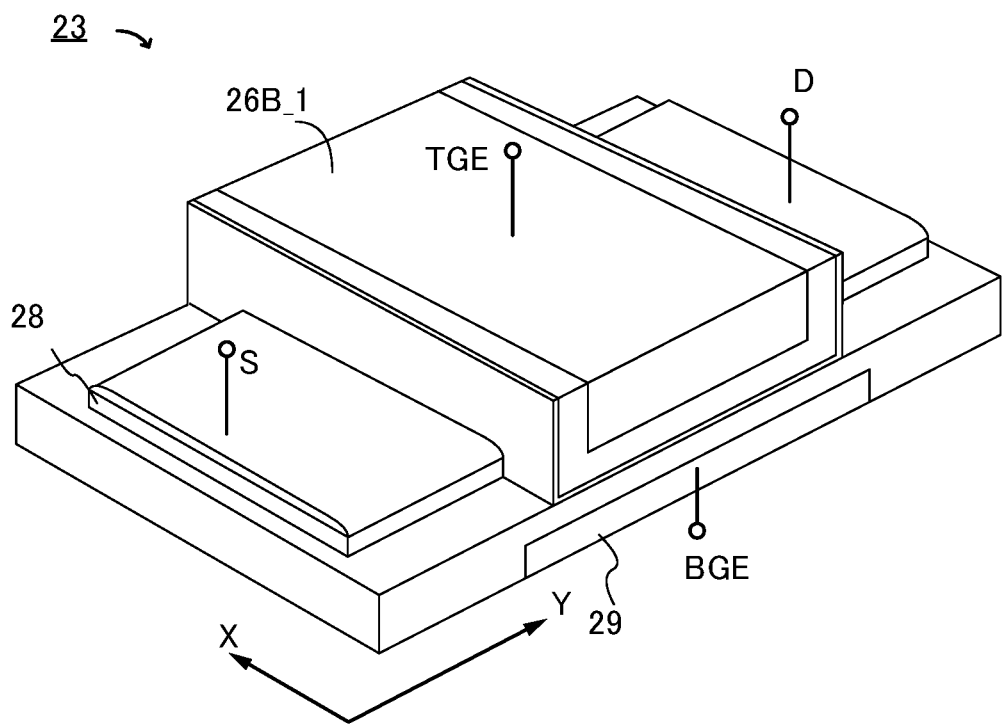
FIG. 3A and FIG. 3B are a perspective view and a circuit diagram illustrating one embodiment of the present invention.
Figure 3B:
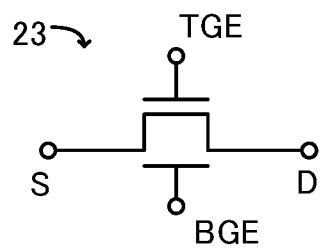

FIG. 3A shows a perspective view of the transistor 23B in an X direction and a Y direction shown in FIG. 2C (a transistor that can be used as each of the transistors 23A to 23D is also referred to as the transistor 23). FIG. 3A illustrates the conductor 26B_1 and the conductor 29 which are provided to overlap with the island-shaped oxide layers 28. In FIG. 3A, the conductor 29 is a back gate electrode and is illustrated as an electrode BGE. In FIG. 3A, the conductor 26B_1 is a top gate electrode and is illustrated as an electrode TGE. In FIG. 3A, one of the island-shaped oxide layers 28 that separates the conductor 26B_1 and the conductor 29 is illustrated as a terminal "S", and the other is illustrated as a terminal "D". The transistor 23 illustrated in FIG. 3A can be represented by the symbol shown in FIG. 3B. Note that a structure of the transistor is described in detail in Embodiment 2.

Next, modification examples of the schematic cross-sectional view of the semiconductor device 10 illustrated in FIG. 1B are described with reference to FIG. 4A, FIG. 4B, and FIG. 5A to FIG. 5C.

Figure 4A:
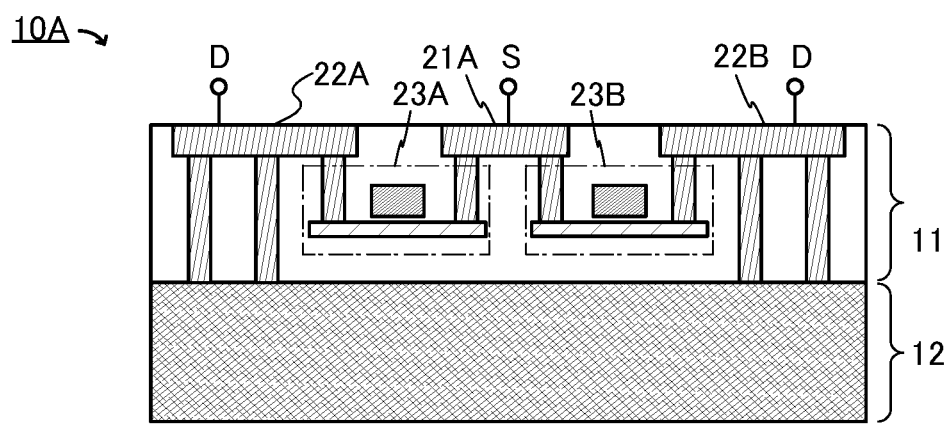
FIG. 4A and FIG. 4B are schematic cross-sectional views each illustrating one embodiment of the present invention.

A semiconductor device 10A shown in FIG. 4A illustrates a structure example in which an electrode connected to an external extraction electrode or an external metal wiring is provided on a top surface of the device 11, as in FIG. 1B. In the structure example of FIG. 4A, the conductor 21A connected to sources of the transistors 23A and 23B and the conductors 22A and 22B connected to drains of the transistors 23A and 23B can be provided on the same surface as the top surface of the device 11.

Figure 4B:
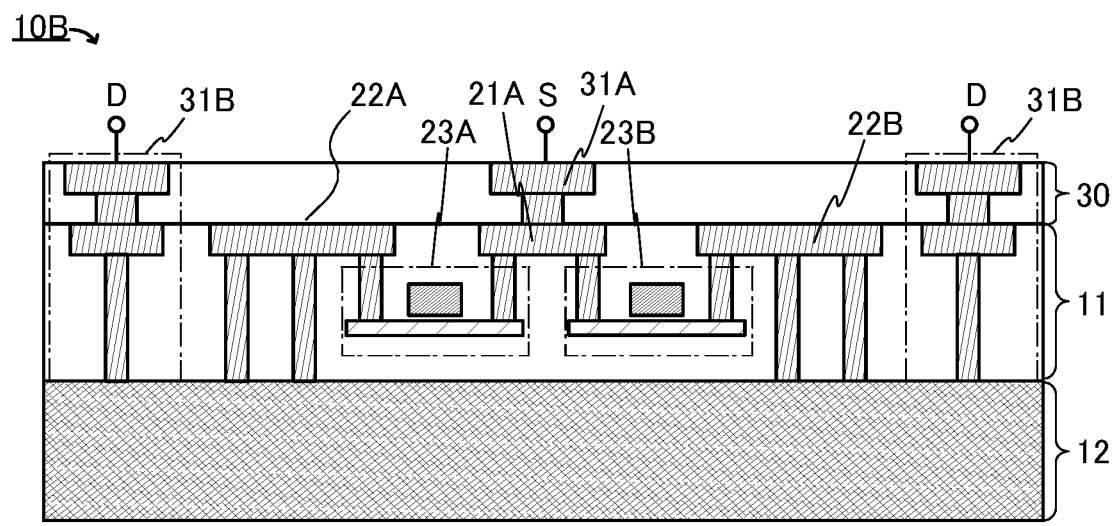

A semiconductor device 10B shown in FIG. 4B illustrates a structure example which is different from that in FIG. 4A and in which the electrode connected to the external extraction electrode or the external metal wiring is provided on the top surface of the device 11. In the structure example of FIG. 4B, the sources of the transistors 23A and 23B are connected to a conductor 31A provided in an electrode layer 30 which is in a layer above the device 11 through the conductor 21A connected to the sources of the transistors 23A and 23B, and the drains of the transistors 23A and 23B are connected to conductors 31B provided in the electrode layer 30 which is in the layer above the device 11 through the conductors 22A and 22B and the silicon substrate 12. Also in the semiconductor device 10B shown in FIG. 4B, the electrodes can be provided on the same surface as the top surface of the device 11, as in FIG. 4A.

Figure 5A:
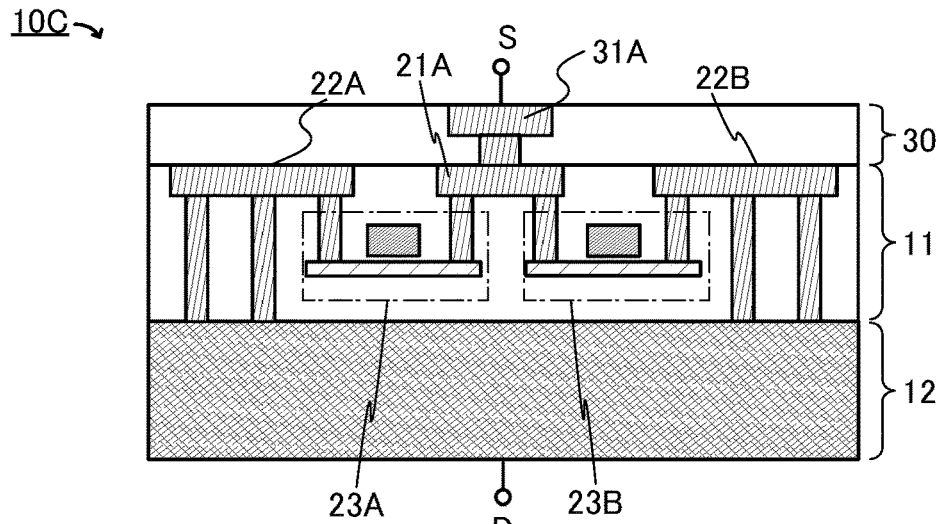
FIG. 5A, FIG. 5B, and FIG. 5C are schematic cross-sectional views each illustrating one embodiment of the present invention.

A semiconductor device 10C shown in FIG. 5A illustrates a structure example which is different from the structures in FIG. 4A and FIG. 4B and in which the silicon substrate 12 also serves as the electrode connected to the external extraction electrode or the external metal wiring. In the structure example of FIG. 5A, the conductor 31A provided in the electrode layer 30 which is in the layer above the device 11 through the conductor 21A connected to the sources of the transistors 23A and 23B and the silicon substrate 12 which is in a layer below the device 11 through the conductors 22A and 22B connected to the drains of the transistors 23A and 23B can be provided on surfaces on different sides. The structure in which the silicon substrate 12 side is used as the electrode can increase the area where the external extraction electrode, a metal wiring for wire bonding, or the like is bonded, allowing easy electrical connection.

In a semiconductor device 10D shown in FIG. 5B, which has a structure different from that in FIG. 5A, the conductor 31A provided in the electrode layer 30 which is in the layer above the device 11 through the conductor 21A connected to the sources of the transistors 23A and 23B, and the silicon substrate 12 through the conductors 22A and 22B which are in a layer below the oxide layers connected to the drains of the transistors 23A and 23B can be provided on surfaces on different sides. The structure in which the silicon substrate 12 side is used as the electrode allows easy connection to the external extraction electrode or the metal wiring for wire bonding. Furthermore, when the conductors 22A and 22B are provided in the layer below the oxide layers, a path in releasing heat can be made short.

Figure 5B:
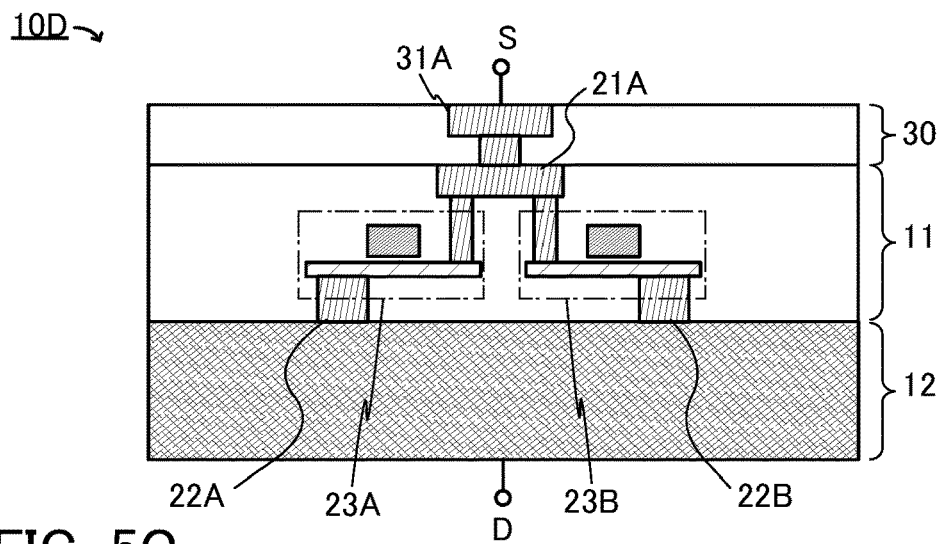
Figure 5C:
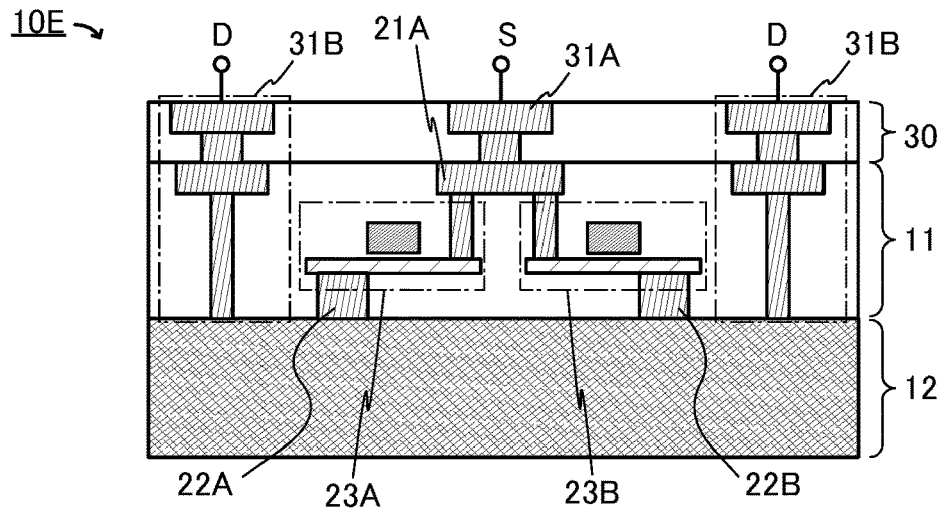

Note that the semiconductor device 10D shown in FIG. 5B has a structure in which the silicon substrate 12 is connected to the external extraction electrode or the metal wiring for wire bonding but may have another structure. For example, as in a semiconductor device 10E in FIG. 5C, the electrodes can be provided on the same surface as the top surface of the device 11 through the conductors 31A, 31B, and the like provided in the electrode layer 30. With this structure, also in the structure in FIG. 5B, the electrodes can be provided on the same surface as the top surface of the device 11, as in FIG. 4A.

Figure 6A:
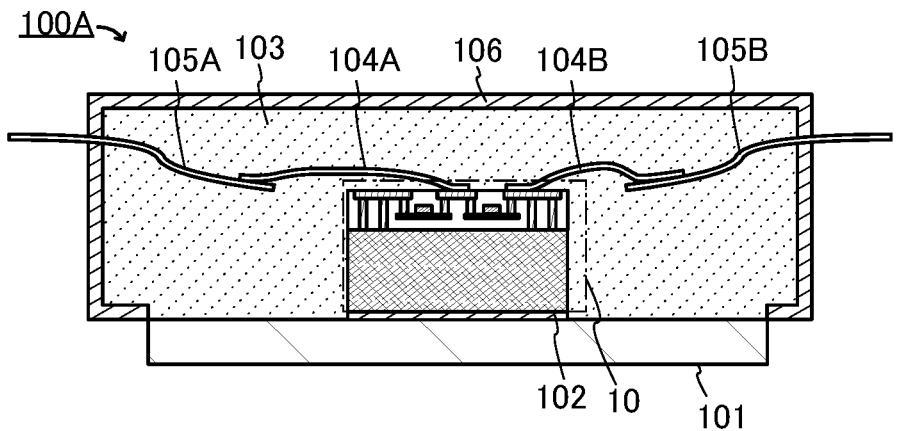
FIG. 6A, FIG. 6B, and FIG. 6C are schematic cross-sectional views each illustrating one embodiment of the present invention.
Figure 6B:
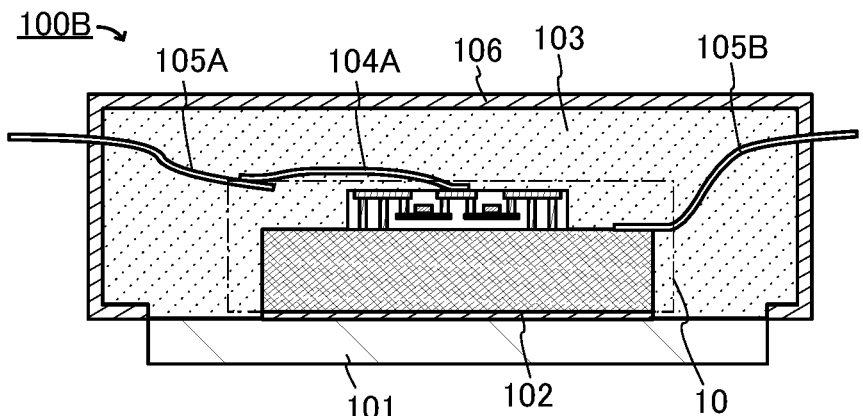
Figure 6C:
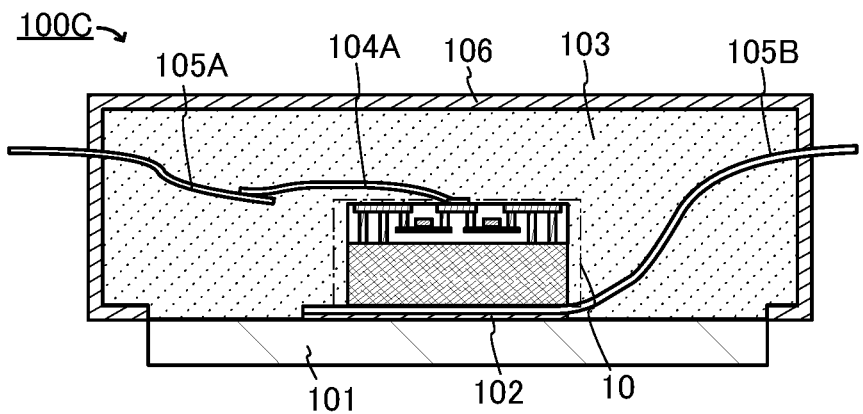

FIG. 6A to FIG. 6C each illustrate an example of a schematic cross-sectional view of an electronic component in which the above-described semiconductor device 10 is provided in a housing. Note that the electronic component including the semiconductor device 10 in the housing is a device including a transistor that utilizes semiconductor characteristics and thus referred to as a semiconductor device in some cases.

In a schematic cross-sectional view of FIG. 6A, an electronic component 100A includes the semiconductor device 10, metal wirings 104A and 104B, extraction electrodes 105A and 105B, and a resin layer 103 in a housing 106. The semiconductor device 10 is fixed to a substrate 101 with an adhesive layer 102 in the housing 106. Note that the semiconductor device 10 illustrated in FIG. 6A has a structure illustrated in FIG. 4A and FIG. 4B in which connection to the extraction electrodes is made on the top surface of the device 11. The substrate 101 and the adhesive layer 102 are preferably formed using a material having a higher thermal conductivity than a material for a peripheral component in order that the heat dissipation property of the silicon substrate can be increased.

The semiconductor device 10 is covered with the resin layer 103 in the housing 106. The extraction electrode 105A is connected to the electrode on the top surface of the device included in the semiconductor device 10 through the metal wiring 104A. The extraction electrode 105B is connected to the electrode on the top surface of the device included in the semiconductor device 10 through the metal wiring 104B.

In a schematic cross-sectional view of FIG. 6B, an electronic component 100B includes the semiconductor device 10, the metal wiring 104A, the extraction electrodes 105A and 105B, and the resin layer 103 in the housing 106. The semiconductor device 10 is fixed to the substrate 101 with the adhesive layer 102 in the housing 106. Note that the semiconductor device 10 illustrated in FIG. 6B has a structure illustrated in FIG. 5A and FIG. 5B in which connection to the extraction electrodes is made on the top surface of the device 11 and the silicon substrate 12 side.

The semiconductor device 10 is covered with the resin layer 103 in the housing 106. The extraction electrode 105A is connected to the electrode on the top surface of the device included in the semiconductor device 10 through the metal wiring 104A. The extraction electrode 105B is directly connected to the silicon substrate included in the semiconductor device 10.

In a schematic cross-sectional view of FIG. 6C, an electronic component 100C includes the semiconductor device 10, the metal wiring 104A, the extraction electrodes 105A and 105B, and the resin layer 103 in the housing 106. The semiconductor device 10 is fixed to the substrate 101 with the adhesive layer 102 with the extraction electrode 105B therebetween in the housing 106. Note that the semiconductor device 10 illustrated in FIG. 6C has a structure illustrated in FIG. 5A and FIG. 5B in which connection to the extraction electrodes is made on the top surface of the device 11 and the silicon substrate 12 side.

The semiconductor device 10 is covered with the resin layer 103 in the housing 106. The extraction electrode 105A is connected to the electrode on the top surface of the device included in the semiconductor device 10 through the metal wiring 104A. The extraction electrode 105B is directly connected to the silicon substrate included in the semiconductor device 10.

Figure 7:
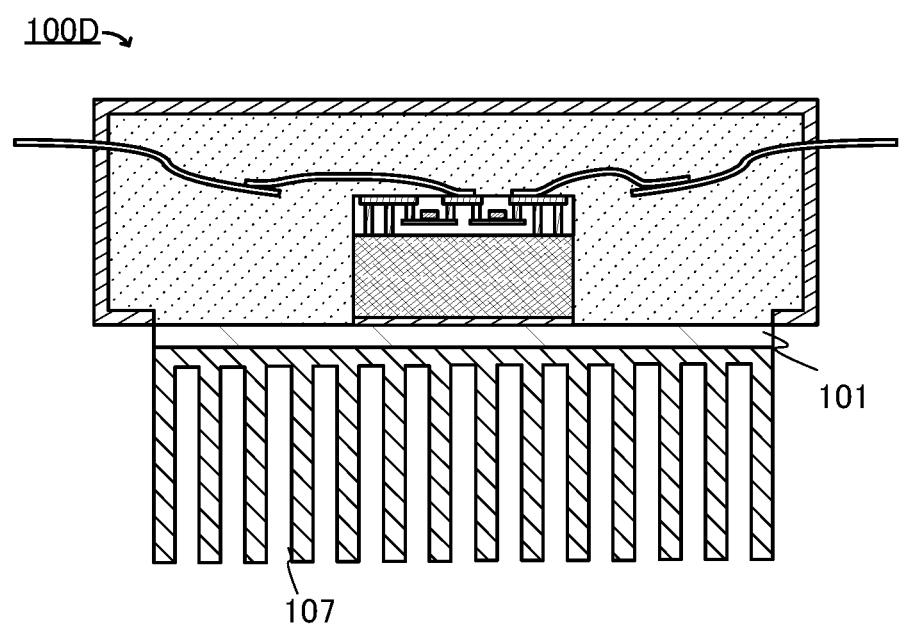
FIG. 7 is a schematic cross-sectional view illustrating one embodiment of the present invention.

Note that each of the electronic components 100A to 100C illustrated in FIG. 6A to FIG. 6C can be connected to a heat sink. FIG. 7 illustrates an electronic component 100D provided with a heat sink 107 on the substrate 101 side. With this structure, the heat dissipation property from the silicon substrate 12 side can be increased.

Next, FIG. 8A to FIG. 8D illustrate modification examples of the top view of the device 11 illustrated in FIG. 2A.

Figure 8A:
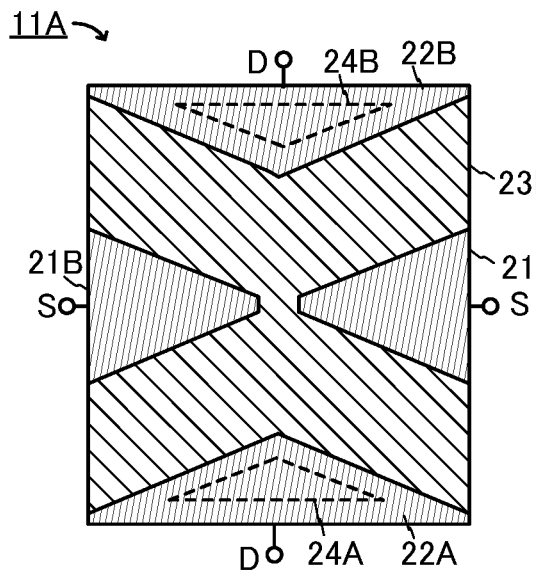
FIG. 8A, FIG. 8B, FIG. 8C, and FIG. 8D are top views each illustrating one embodiment of the present invention.

FIG. 8A illustrates a device 11A including the conductors 21A and 21B, the conductors 22A and 22B, and an X-shaped region 23R where the transistors 23A to 23D are provided, as in FIG. 2A. The device 11A shown in FIG. 8A has a structure in which the silicon substrate 12 is connected to the drains of the transistors 23A to 23D in the openings 24A and 24B reaching the silicon substrate 12 in regions overlapping with the conductors 22A and 22B connected to the drains of the transistors 23A to 23D.

Figure 8B:
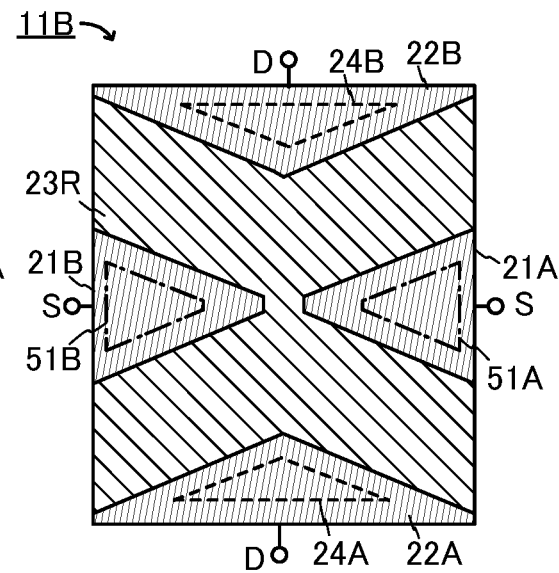

FIG. 8B illustrates a device 11B including the conductors 21A and 21B, the conductors 22A and 22B, and the region 23R. The device 11B shown in FIG. 8B has a structure in which transistors provided on the silicon substrate 12 can be included in regions 51A and 51B of the silicon substrate 12 which overlap with the conductors 21A and 21B connected to the sources of the transistors 23A to 23D. With this structure, a logic circuit can be formed in a position apart from the openings 24A and 24B to which heat of the self-heating drains is released.

Figure 8C:
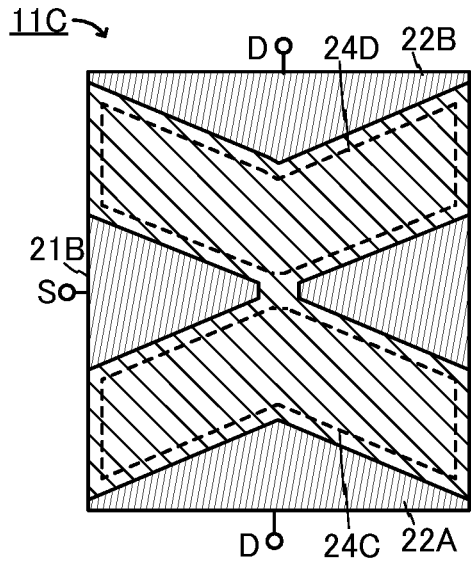

FIG. 8C illustrates a device 11C including the conductors 21A and 21B, the conductors 22A and 22B, and the region 23R. The device 11C shown in FIG. 8C has a structure in which the silicon substrate 12 is connected to the drains of the transistors 23A to 23D in openings 24C and 24D reaching the silicon substrate 12 in regions overlapping with the region 23R. This structure enables heat generated at the drains to be released and heat of the transistors to be homogenized, so that the transistor characteristics can be stabilized. Moreover, this structure is more effective in reducing wiring resistance or releasing heat in a short path than the structure in which a wiring formed of a conductor is led to the silicon substrate 12.

Figure 8D:
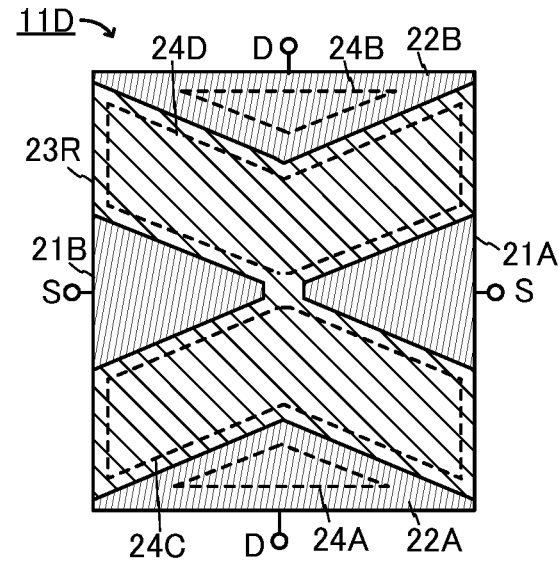

As in a device 11D illustrated in FIG. 8D, a structure in which the structure of the device 11A illustrated in FIG. 8A and the structure of the device 11C illustrated in FIG. 8C are combined can also be employed.

FIG. 9A to FIG. 9D show an operation example and an application example of the semiconductor device and the electronic component described above.

Figure 9A:
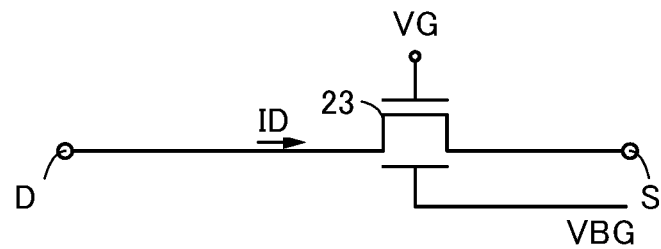
FIG. 9A, FIG. 9B, and FIG. 9C are a circuit diagram, a graph, and a block diagram illustrating one embodiment of the present invention.

FIG. 9A illustrates a state in which a current ID flows between a source (S) and a drain (D) when a voltage VG is applied to a gate of the transistor 23 included in a semiconductor device 20 and a voltage VBG is applied to a back gate thereof.

Figure 9B:
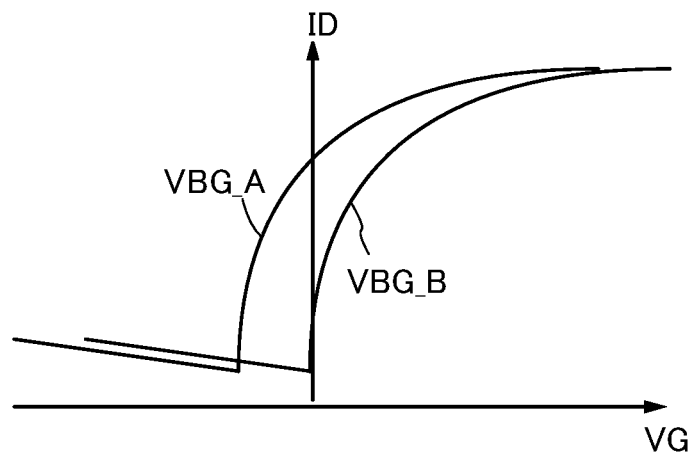

FIG. 9B is a schematic view of a graph showing the current-voltage characteristics of the transistor 23 illustrated in FIG. 9A. States with different electrical characteristics can be switched by switching the back gate voltage between voltages VBG_A and VBG_B (<VBG_A). For example, it is possible to switch between a state in which the amount of current flowing between the source (S) and the drain (D) is increased when the back gate voltage is set to the voltage VBG_A to turn on the transistor 23 and a state in which the amount of current flowing between the source (S) and the drain (D) is significantly reduced when the back gate voltage is set to the voltage VBG_B to turn off the transistor 23.

Figure 9C:
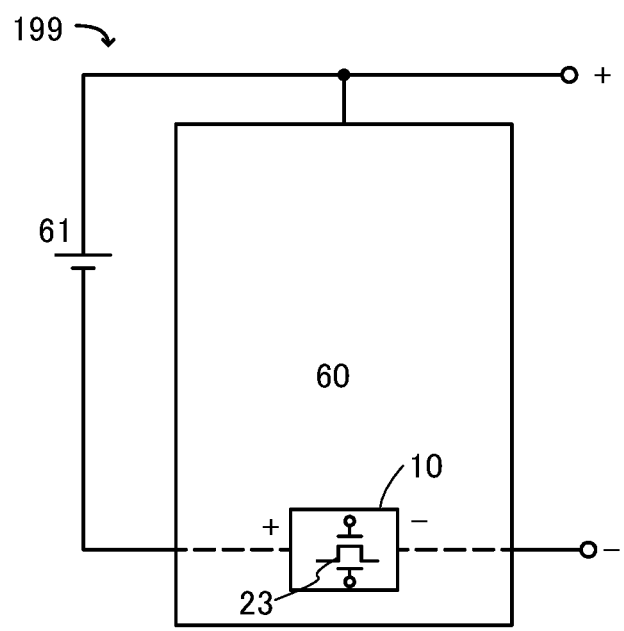

When an OS transistor is used as the transistor 23 functioning as a power transistor in the semiconductor device 10, a structure including the semiconductor device 10 in a battery protection circuit 60 can also be employed as in a power storage device 199 including a battery 61 illustrated in FIG. 9C.

As described above, in the structure of the semiconductor device of one embodiment of the present invention, the silicon substrate and the OS transistor are provided to be stacked, and heat generated on the drain side of the transistor can be released to the silicon substrate side through the opening. In other words, the silicon substrate can function as a heat sink. Thus, the variation in electrical characteristics or the element degradation of the transistor due to heat generation can be inhibited, so that the semiconductor device can have high reliability.

Embodiment 2

In this embodiment, examples of cross-sectional structures of the semiconductor devices described in the above embodiment are described with reference to drawings.

Figure 10:
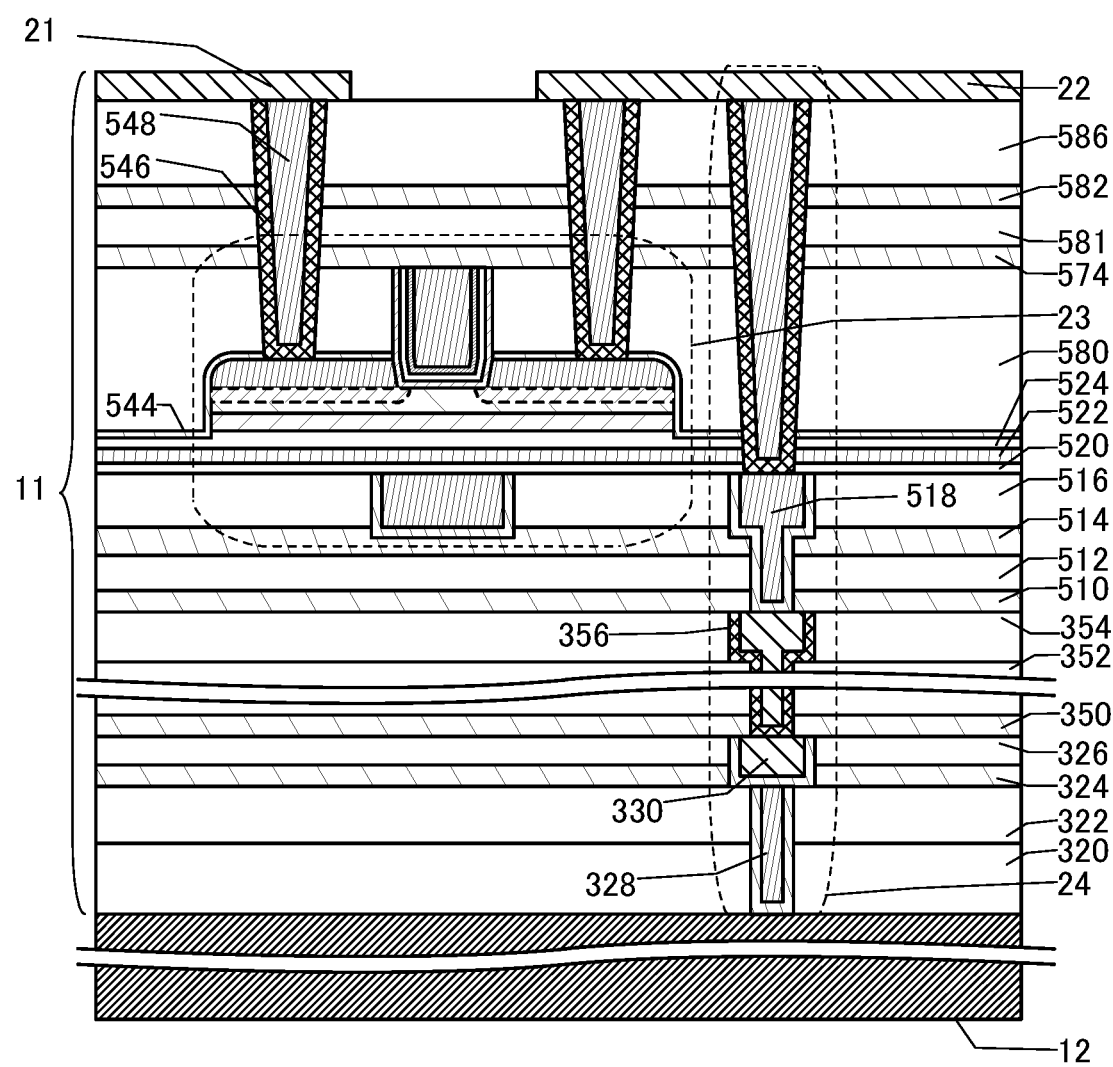
FIG. 10 is a cross-sectional schematic view illustrating one embodiment of the present invention.
Figure 11A:
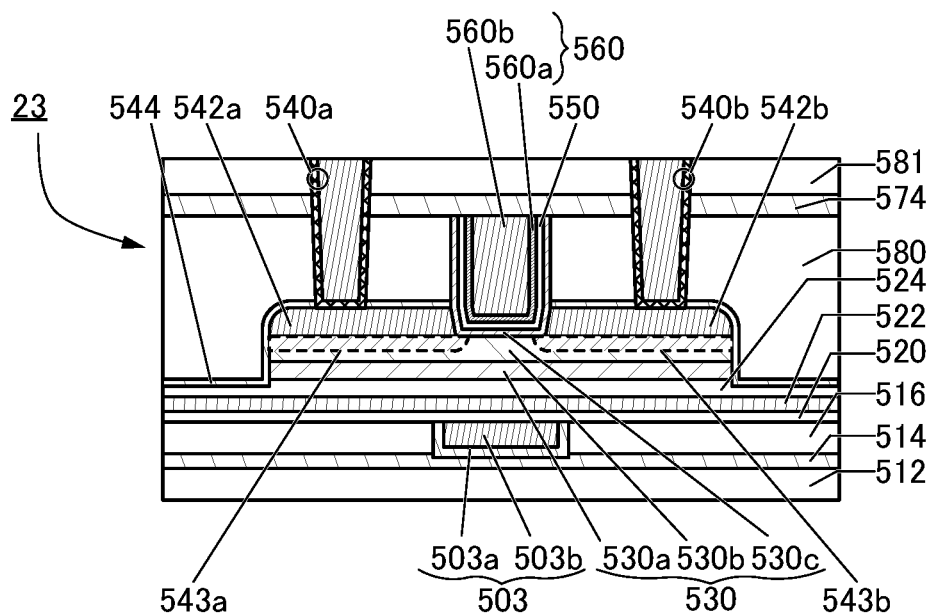
FIG. 11A and FIG. 11B are schematic cross-sectional views illustrating one embodiment of the present invention.
Figure 11B:
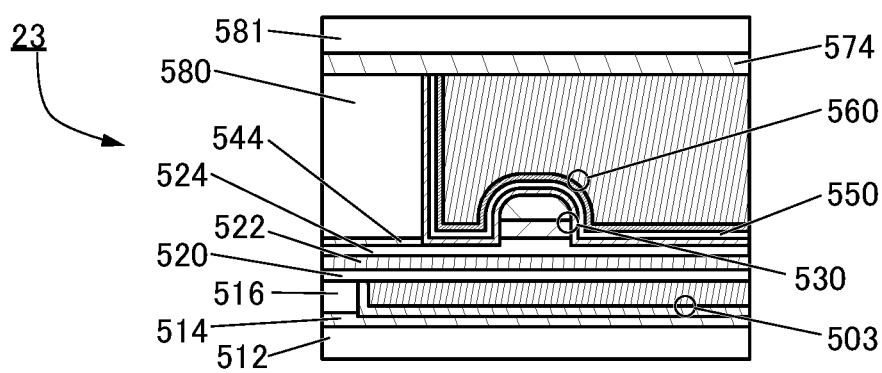

In a semiconductor device shown in FIG. 10, the transistor 23 included in the device 11 is provided over the silicon substrate 12. Furthermore, the semiconductor device shown in FIG. 10 illustrates the conductor 21 connected to the source of the transistor 23 and the conductor 22 connected to the drain thereof. Moreover, the semiconductor device shown in FIG. 10 illustrates an opening 24 that reaches the silicon substrate 12 from the conductor 22; the opening 24 corresponds to the openings 24A and 24B described in Embodiment 1. FIG. 11A is a cross-sectional view of the transistor 23 in the channel length direction, and FIG. 11B is a cross-sectional view of the transistor 23 in the channel width direction.

The transistor 23 is an OS transistor corresponding to each of the transistors 23A to 23D described in Embodiment 1. The transistor 23 has a low off-state current. Therefore, the power consumption of an electronic device including the semiconductor device can be reduced.

The silicon substrate 12 is a substrate to which p-type conductivity is imparted by introduction of boron or the like for increasing a thermal conductivity. The silicon substrate to which p-type conductivity is imparted can have an improved thermal conductivity as compared to a silicon substrate to which n-type conductivity is imparted or a silicon substrate to which conductivity is not imparted. Note that the silicon substrate may be a substrate to which n-type conductivity of arsenic, phosphorus, or the like is imparted. Note that the silicon substrate 12 may have a structure including a p-channel transistor or an n-channel transistor.

An insulator 320, an insulator 322, an insulator 324, and an insulator 326 are provided to be stacked in this order over the silicon substrate 12.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification and the like, silicon oxynitride refers to a material that contains oxygen at a higher proportion than nitrogen, and silicon nitride oxide refers to a material that contains nitrogen at a higher proportion than oxygen. Furthermore, in this specification and the like, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for eliminating a level difference of the silicon substrate 12 or the like provided below the insulator 322. For example, the top surface of the insulator 322 may be planarized by planarization treatment using a chemical mechanical polishing (CMP) method or the like to improve planarity.

It is preferable to use, for the insulator 324, a film having a barrier property that prevents diffusion of hydrogen and impurities from the silicon substrate 12 or the like into a region where the transistor 23 is provided.

For the film having a barrier property against hydrogen, silicon nitride formed by a CVD method can be used, for example. Here, the diffusion of hydrogen to a semiconductor element including an oxide semiconductor, such as the transistor 23, degrades the characteristics of the semiconductor element in some cases. Therefore, a film that inhibits hydrogen diffusion is preferably provided between the transistor 23 and the silicon substrate 12. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low permittivity is used for the interlayer film, the parasitic capacitance generated between wirings can be reduced.

In addition, a conductor 328, a conductor 330, and the like that connect the silicon substrate 12 and the transistor 23 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, it is preferable to be formed with a low-resistance conductive material such as aluminum or copper. The use of a low-resistance conductive material can reduce wiring resistance.

A wiring layer may be provided over the insulator 326 and the conductor 330. For example, in FIG. 10, an insulator 350, an insulator 352, and an insulator 354 are stacked in this order. Furthermore, a conductor 356 is formed in the insulator 350, the insulator 352, and the insulator 354. The conductor 356 has a function of a plug or a wiring that connects the silicon substrate 12 and the transistor 23. Note that the conductor 356 can be provided using a material similar to that for the conductor 328 or the conductor 330.

For example, like the insulator 324, the insulator 350 is preferably formed using an insulator having a barrier property against hydrogen. The conductor 356 preferably contains a conductor having a barrier property against hydrogen. In particular, the conductor having a barrier property against hydrogen is formed in an opening portion provided in the insulator 350 having a barrier property against hydrogen. In such a structure, the silicon substrate 12 and the transistor 23 can be separated by a barrier layer, so that the diffusion of hydrogen from the silicon substrate 12 into the transistor 23 can be inhibited.

For the conductor having a barrier property against hydrogen, tantalum nitride is preferably used, for example. In addition, the use of a stack including tantalum nitride and tungsten, which has high conductivity, can inhibit diffusion of hydrogen from the silicon substrate 12 while the conductivity of a wiring is kept. In that case, a structure is preferable in which a tantalum nitride layer having a barrier property against hydrogen is in contact with the insulator 350 having a barrier property against hydrogen.

An insulator 510, an insulator 512, an insulator 514, and an insulator 516 are stacked in this order over the insulator 354. A material having a barrier property against oxygen or hydrogen is preferably used for any of the insulator 510, the insulator 512, the insulator 514, and the insulator 516.

For example, for the insulator 510 and the insulator 514, it is preferable to use a film having a barrier property that prevents diffusion of hydrogen or impurities from the silicon substrate 12 or the like into the region where the transistor 23 is provided. Thus, it is preferable to use a material similar to that for the insulator 324.

For the film having a barrier property against hydrogen, silicon nitride formed by a CVD method can be used, for example. Here, the diffusion of hydrogen to a semiconductor element including an oxide semiconductor, such as the transistor 23, degrades the characteristics of the semiconductor element in some cases. Therefore, a film that inhibits hydrogen diffusion is preferably provided between the silicon substrate 12 and the transistor 23. The film that inhibits hydrogen diffusion is specifically a film from which a small amount of hydrogen is released.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors in a change in electrical characteristics of the transistor. Accordingly, aluminum oxide can prevent entry of impurities such as hydrogen and moisture into the transistor 23 in a manufacturing process and after manufacturing of the transistor. In addition, release of oxygen from the metal oxide included in the transistor 23 can be inhibited. Therefore, aluminum oxide is suitably used for a protective film of the transistor 23.

In addition, for the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 23 (a conductor 503 for example), and the like are embedded in the insulator 510, the insulator 512, the insulator 514, and the insulator 516. The conductor 518 has a function of a plug or a wiring that connects the silicon substrate 12 and the transistor 23. The conductor 518 can be provided using a material similar to that for the conductor 328 or the conductor 330.

In particular, the conductor 518 in a region in contact with the insulator 510 and the insulator 514 is preferably a conductor having a barrier property against oxygen, hydrogen, and water. In such a structure, the silicon substrate 12 and the transistor 23 can be separated by a layer having a bather property against oxygen, hydrogen, and water; thus, the diffusion of hydrogen from the silicon substrate 12 into the transistor 23 can be inhibited.

The transistor 23 is provided above the insulator 516.

As shown in FIG. 11A and FIG. 11B, the transistor 23 includes the conductor 503 positioned to be embedded in the insulator 514 and the insulator 516, an insulator 520 positioned over the insulator 516 and the conductor 503, an insulator 522 positioned over the insulator 520, an insulator 524 positioned over the insulator 522, an oxide 530a positioned over the insulator 524, an oxide 530b positioned over the oxide 530a, a conductor 542a and a conductor 542b positioned apart from each other over the oxide 530b, an insulator 580 that is positioned over the conductor 542a and the conductor 542b and is provided with an opening formed to overlap with a region between the conductor 542a and the conductor 542b, an oxide 530c positioned on a bottom surface and a side surface of the opening, an insulator 550 positioned on a formation surface of the oxide 530c, and a conductor 560 positioned on a formation surface of the insulator 550.

As shown in FIG. 11A and FIG. 11B, an insulator 544 is preferably provided between the insulator 580 and the oxide 530a, the oxide 530b, the conductor 542a, and the conductor 542b. In addition, as shown in FIG. 11A and FIG. 11B, the conductor 560 preferably includes a conductor 560a provided inside the insulator 550 and a conductor 560b provided to be embedded inside the conductor 560a. As shown in FIG. 11A and FIG. 11B, an insulator 574 is preferably provided over the insulator 580, the conductor 560, and the insulator 550.

Note that in the following description, the oxide 530a, the oxide 530b, and the oxide 530c are sometimes collectively referred to as an oxide 530.

Note that although a structure of the transistor 23 in which three layers of the oxide 530a, the oxide 530b, and the oxide 530c are stacked in a region where a channel is formed and its vicinity is shown, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Furthermore, although the conductor 560 is shown to have a stacked-layer structure of two layers in the transistor 23, the present invention is not limited thereto. For example, the conductor 560 may have a single-layer structure or a stacked-layer structure of three or more layers. The transistor 23 shown in FIG. 10, FIG. 11A, and FIG. 11B is an example, and the structure is not limited thereto; an appropriate transistor can be used in accordance with a circuit structure or a driving method.

Here, the conductor 560 functions as a gate electrode of the transistor 23, and the conductor 542a and the conductor 542b each function as a source electrode or a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, the gate electrode can be positioned between the source electrode and the drain electrode in a self-aligned manner in the transistor 23. Thus, the conductor 560 can be formed without an alignment margin, resulting in a reduction in the area occupied by the transistor 23. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 23 can be increased, and the transistor 23 can have high frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 23 can be controlled by changing a potential applied to the conductor 503 independently of a potential applied to the conductor 560. In particular, the threshold voltage of the transistor 23 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to include a region overlapping with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 23 having a structure in which the conductor 503a and the conductor 503b are stacked is shown, the present invention is not limited thereto. For example, the conductor 503 may be provided as a single layer or to have a stacked-layer structure of three or more layers.

Here, for the conductor 503a, a conductive material which has a function of inhibiting diffusion of impurities such as a hydrogen atom, a hydrogen molecule, a water molecule, and a copper atom (through which the impurities are less likely to pass) is preferably used. Alternatively, it is preferable to use a conductive material which has a function of inhibiting diffusion of oxygen (e.g., at least one of an oxygen atom, an oxygen molecule, and the like) (through which the oxygen is less likely to pass). Note that in this specification and the like, a function of inhibiting diffusion of impurities or oxygen means a function of inhibiting diffusion of any one or all of the above impurities and the above oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. In that case, the conductor 503a is not necessarily provided. Note that the conductor 503b is illustrated as a single layer but may have a stacked-layer structure, for example, a stack of the above conductive material and titanium or titanium nitride.

The insulator 520, the insulator 522, and the insulator 524 have a function of a second gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 23 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in a range of higher than or equal to 100° C. and lower than or equal to 700° C., or higher than or equal to 100° C. and lower than or equal to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed by occurrence of a reaction in which a bond of $V_OH$ is cut, i.e., occurrence of a reaction of "$V_OH \rightarrow V_O+H$". Part of hydrogen generated at this time is bonded to oxygen to be $H_2O$, and removed from the oxide 530 or an insulator near the oxide 530 in some cases. Part of hydrogen is diffused into or gettered by the conductor 542 in some cases.

For the microwave treatment, for example, an apparatus including power supply that generates high-density plasma or an apparatus including power supply that applies RF to the substrate side is suitably used. High-density oxygen radicals can be generated using a gas containing oxygen and high-density plasma, for example. By applying RF to the substrate side, the oxygen radicals generated by high-density plasma can be introduced into the oxide 530 or the insulator near the oxide 530 efficiently. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 23, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "$V_O+O \rightarrow null$". Furthermore, hydrogen remaining in the oxide 530 reacts with oxygen supplied to the oxide 530, so that the hydrogen can be removed as $H_2O$ (dehydration). This can inhibit recombination of hydrogen remaining in the oxide 530 with oxygen vacancies and formation of $V_OH$.

When the insulator 524 includes an excess-oxygen region, it is preferable that the insulator 522 have a function of inhibiting diffusion of oxygen (e.g., oxygen atoms and oxygen molecules) (or that the insulator 522 be less likely to transmit the above oxygen).

When the insulator 522 has a function of inhibiting diffusion of oxygen or impurities, oxygen contained in the oxide 530 is not diffused to the insulator 520 side, which is preferable. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as generation of leakage current may arise because of a thinner gate insulating film. When a high-k material is used for the insulator functioning as the gate insulating film, a gate potential at the time when the transistor operates can be reduced while the physical thickness is maintained.

It is particularly preferable to use an insulator containing an oxide of one or both of aluminum and hafnium, which is an insulating material having a function of inhibiting diffusion of impurities, oxygen, and the like (i.e., an insulating material through which the oxygen is less likely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and entry of impurities such as hydrogen from the periphery of the transistor 23 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

It is preferable that the insulator 520 be thermally stable. For example, silicon oxide and silicon oxynitride are suitable because they are thermally stable. Furthermore, when an insulator which is a high-k material is combined with silicon oxide or silicon oxynitride, the insulator 520 having a stacked-layer structure that has thermal stability and a high relative permittivity can be obtained.

Note that in the transistor 23 in FIG. 11A and FIG. 11B, the insulator 520, the insulator 522, and the insulator 524 are illustrated as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 23, a metal oxide functioning as an oxide semiconductor is preferably used as the oxide 530 including the channel formation region. For example, as the oxide 530, a metal oxide such as an In-M-Zn oxide (the element M is one kind or a plurality of kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, the In-M-Zn oxide which can be used for the oxide 530 is preferably a CAAC-OS (C-Axis Aligned Crystal Oxide Semiconductor) or a CAC-OS (Cloud-Aligned Composite Oxide Semiconductor). Furthermore, as the oxide 530, an In—Ga oxide or an In—Zn oxide may be used. The CAAC-OS and the CAC-OS will be described later. Note that in order to increase the on-state current of the transistor 23, an In—Zn oxide is preferably used as the oxide 530. In the case where an In—Zn oxide is used as the oxide 530, for example, a stacked-layer structure in which an In—Zn oxide is used as the oxide 530a and In-M-Zn oxides are used as the oxide 530b and the oxide 530c, or a stacked-layer structure in which an In-M-Zn oxide is used as the oxide 530a and an In—Zn oxide is used as one of the oxide 530b and the oxide 530c can be employed.

A metal oxide with a low carrier concentration is preferably used for the transistor 23. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. In the case where hydrogen enters an oxygen vacancy in the oxide 530, the oxygen vacancy and the hydrogen are bonded to each other to form $V_OH$ in some cases. The $V_OH$ serves as a donor and an electron that is a carrier is generated in some cases. In other cases, bonding of part of hydrogen to oxygen bonded to a metal atom generates electrons serving as carriers. Thus, a transistor using a metal oxide containing much hydrogen is likely to have normally-on characteristics. Moreover, hydrogen in a metal oxide is easily transferred by a stress such as heat or an electric field; thus, a large amount of hydrogen in a metal oxide might reduce the reliability of the transistor. In one embodiment of the present invention, $V_OH$ in the oxide 530 is preferably reduced as much as possible so that the oxide 530 becomes a highly purified intrinsic or substantially highly purified intrinsic oxide. It is effective to remove impurities such as moisture and hydrogen in a metal oxide (sometimes described as dehydration or dehydrogenation treatment) and to compensate for oxygen vacancies by supplying oxygen to the metal oxide (sometimes described as oxygen adding treatment) in order to obtain a metal oxide whose $V_OH$ is sufficiently reduced. When a metal oxide with a sufficiently low concentration of impurities such as $V_OH$ is used for a channel formation region of a transistor, the transistor can have stable electrical characteristics.

A defect in which hydrogen has entered an oxygen vacancy can function as a donor of a metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Consequently, when a metal oxide is used for the oxide 530, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently low concentration of impurities such as hydrogen is used for a channel formation region of a transistor, the transistor can have stable electrical characteristics.

When a metal oxide is used as the oxide 530, the carrier concentration of the metal oxide in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. Note that the lower limit of the carrier concentration of the metal oxide in the channel formation region is not particularly limited and can be, for example, $1\times10^{-9}$ cm$^{-3}$.

When a metal oxide is used for the oxide 530, contact between the conductor 542 (the conductor 542a and the conductor 542b) and the oxide 530 may make oxygen in the oxide 530 diffuse into the conductor 542, resulting in oxidation of the conductor 542. It is highly possible that oxidation of the conductor 542 lowers the conductivity of the conductor 542. Note that diffusion of oxygen in the oxide 530 into the conductor 542 can be interpreted as absorption of oxygen in the oxide 530 by the conductor 542.

When oxygen in the oxide 530 is diffused into the conductor 542 (the conductor 542a and the conductor 542b), a layer is sometimes formed between the conductor 542a and the oxide 530b, and between the conductor 542b and the oxide 530b. The layer contains more oxygen than the conductor 542 does, and thus presumably has an insulating property. In this case, a three-layer structure of the conductor 542, the layer, and the oxide 530b can be regarded as a three-layer structure of a metal, an insulator, and a semiconductor and is sometimes referred to as a MIS (Metal-Insulator-Semiconductor) structure or a diode junction structure having an MIS structure as its main part.

Note that the layer is not necessarily formed between the conductor 542 and the oxide 530b. For example, the layer is formed between the conductor 542 and the oxide 530c in some cases. Alternatively, the layer is formed between the conductor 542 and the oxide 530b and between the conductor 542 and the oxide 530c in some cases.

The metal oxide functioning as the channel formation region in the oxide 530 has a bandgap of preferably 2 eV or higher, further preferably 2.5 eV or higher. With the use of a metal oxide having such a wide bandgap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of a plurality of oxide layers that differ in the atomic ratio of metal atoms. Specifically, the atomic proportion of the element M in the constituent elements in the metal oxide used as the oxide 530a is preferably higher than the atomic proportion of the element M in the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. Moreover, a metal oxide that can be used as the oxide 530a or the oxide 530b can be used as the oxide 530c.

Specifically, as the oxide 530a, a metal oxide having In:Ga:Zn=1:3:4 [atomic ratio] or 1:1:0.5 [atomic ratio] is used. As the oxide 530b, a metal oxide having In:Ga:Zn=4:2:3 [atomic ratio] or 1:1:1 [atomic ratio] is used. As the oxide 530c, a metal oxide having In:Ga:Zn=1:3:4 [atomic ratio], Ga:Zn=2:1 [atomic ratio], or Ga:Zn=2:5 [atomic ratio] is used. Specific examples of the oxide 530c having a stacked-layer structure include a stacked-layer structure of In:Ga:Zn=4:2:3 [atomic ratio] and In:Ga:Zn=1:3:4 [atomic ratio], a stacked-layer structure of Ga:Zn=2:1 [atomic ratio] and In:Ga:Zn=4:2:3 [atomic ratio], a stacked-layer structure of Ga:Zn=2:5 [atomic ratio] and In:Ga:Zn=4:2:3 [atomic ratio], and a stacked-layer structure of gallium oxide and In:Ga:Zn=4:2:3 [atomic ratio].

In addition, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at the interface between the oxide 530a and the oxide 530b and the interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, In—Ga—Zn oxide, a Ga—Zn oxide, gallium oxide, or the like is preferably used as the oxide 530a and the oxide 530c.

At this time, the oxide 530b serves as a main carrier path. When the oxide 530a and the oxide 530c have the above structures, the densities of defect states at the interface between the oxide 530a and the oxide 530b and the interface between the oxide 530b and the oxide 530c can be made low. Thus, the influence of interface scattering on carrier conduction becomes small, and the transistor 23 can have a high on-state current.

Note that a semiconductor material that can be used for the oxide 530 is not limited to the above metal oxides. A semiconductor material which has a band gap (a semiconductor material that is not a zero-gap semiconductor) can be used for the oxide 530. For example, a single element semiconductor such as silicon, a compound semiconductor such as gallium arsenide, or a layered material functioning as a semiconductor (also referred to as an atomic layered material or a two-dimensional material) is preferably used as a semiconductor material. In particular, a layered material functioning as a semiconductor is preferably used as a semiconductor material.

Here, in this specification and the like, the layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, the transistor can have a high on-state current.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

As the oxide 530, a transition metal chalcogenide functioning as a semiconductor is preferably used, for example. Specific examples of the transition metal chalcogenide which can be used for the oxide 530 include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), zirconium selenide (typically $ZrSe_2$).

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are illustrated in FIG. 11A and FIG. 11B, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

In addition, as shown in FIG. 11A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier concentration of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 into the oxide 530b through the oxide 530c and the insulator 550 can be inhibited. Furthermore, oxidation of the conductor 560 due to excess oxygen contained in the insulator 580 can be inhibited.

The insulator 550 functions as a first gate insulating film. The insulator 550 is preferably positioned in contact with the inner side (the top surface and the side surface) of the oxide 530c. Like the insulator 524, the insulator 550 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

To efficiently supply excess oxygen contained in the insulator 550 to the oxide 530, a metal oxide may be provided between the insulator 550 and the conductor 560. The metal oxide preferably has a function of inhibiting oxygen diffusion from the insulator 550 into the conductor 560. Providing the metal oxide having a function of inhibiting diffusion of oxygen inhibits diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 550 may have a stacked-layer structure like the second gate insulating film. As miniaturization and high integration of transistors progress, a problem such as generation of leakage current may arise because of a thinner gate insulating film. Therefore, when the insulator functioning as the gate insulating film has a stacked-layer structure of a high-k material and a thermally stable material, a gate potential at the time when the transistor operates can be reduced while the physical thickness is maintained. Furthermore, the stacked-layer structure can be thermally stable and have a high relative permittivity.

Although the conductor 560 functioning as the first gate electrode has a two-layer structure in FIG. 11A and FIG. 11B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting diffusion of oxygen, tantalum, tantalum nitride, ruthenium, or ruthenium oxide is preferably used, for example. For the conductor 560a, the oxide semiconductor that can be used as the oxide 530 can be used. In that case, when the conductor 560b is deposited by a sputtering method, the conductor 560a can have a reduced electrical resistance value to be a conductor. This can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus is preferably a conductor having high conductivity. For example, a conductive material containing tungsten, copper, or aluminum as its main component can be used. The conductor 560b can have a stacked-layer structure, for example, a stacked-layer structure of any of the above conductive materials and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 from which oxygen is released by heating is provided to include a region in contact with the oxide 530c, oxygen in the insulator 580 can be efficiently supplied to the oxide 530a and the oxide 530b through the oxide 530c. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 550. When the insulator 574 is deposited by a sputtering method, excess-oxygen regions can be provided in the insulator 550 and the insulator 580. Thus, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high bather property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a bather film against impurities such as hydrogen.

An insulator 581 functioning as an interlayer film is preferably provided over the insulator 574. As in the insulator 524 or the like, the concentration of impurities such as water and hydrogen in the insulator 581 is preferably reduced.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that will be described later.

An insulator 582 is provided over the insulator 581. A material having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors in a change in electrical characteristics of the transistor. Accordingly, aluminum oxide can prevent entry of impurities such as hydrogen and moisture into the transistor 23 in a manufacturing process and after manufacturing of the transistor. In addition, release of oxygen from the oxide included in the transistor 23 can be inhibited. Therefore, aluminum oxide is suitably used for a protective film of the transistor 23.

An insulator 586 is provided over the insulator 582. For the insulator 586, a material similar to that for the insulator 320 can be used. Furthermore, when a material with a comparatively low permittivity is used for these insulators, parasitic capacitance generated between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

Each of the conductor 546 and the conductor 548 has a function of a plug or a wiring that connects the silicon substrate 12 and the transistor 23. The conductor 546 and the conductor 548 can be provided using materials similar to those for the conductor 328 and the conductor 330.

After the transistor 23 is formed, an opening may be formed to surround the transistor 23 and an insulator having a high barrier property against hydrogen or water may be formed to cover the opening. Surrounding the transistor 23 by the insulator having a high barrier property can prevent entry of moisture and hydrogen from the outside. Alternatively, a plurality of transistors 23 may be collectively surrounded by the insulator having a high barrier property against hydrogen or water. When an opening is formed to surround the transistor 23, for example, the formation of an opening reaching the insulator 522 or the insulator 514 and the formation of the insulator having a high barrier property in contact with the insulator 522 or the insulator 514 are suitable because these formation steps can also serve as part of the manufacturing steps of the transistor 23. The insulator having a high barrier property against hydrogen or water is formed using a material similar to that as the insulator 522, for example.

Next, the conductor 22 and the conductor 21 are provided. Each of the conductor 22 and the conductor 21 has a function of a plug or a wiring that connects the silicon substrate 12 and the transistor 23.

For the conductor 21 and the conductor 22, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, a conductive material such as an indium tin oxide, an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon oxide is added can be used.

Although the conductor 21 and the conductor 22 each having a single-layer structure are illustrated in FIG. 10, the structure is not limited thereto; a stacked-layer structure of two or more layers may be employed. For example, between a conductor having a bather property and a conductor having high conductivity, a conductor that is highly adhesive to the conductor having a bather property and the conductor having high conductivity may be formed.

Using the structure, a semiconductor device using a transistor including an oxide semiconductor can be miniaturized or highly integrated.

Figure 12A:
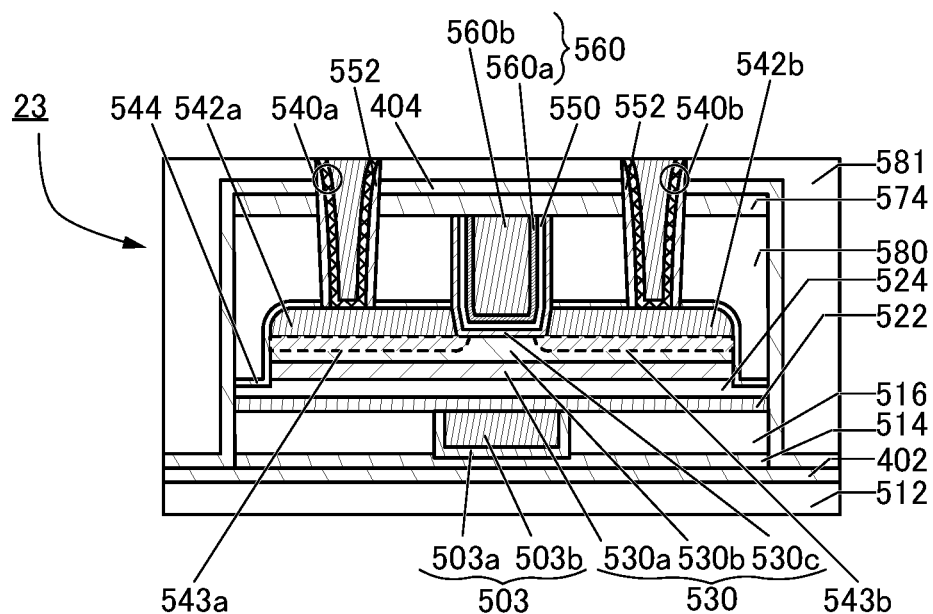
FIG. 12A and FIG. 12B are schematic cross-sectional views illustrating one embodiment of the present invention.
Figure 12B:
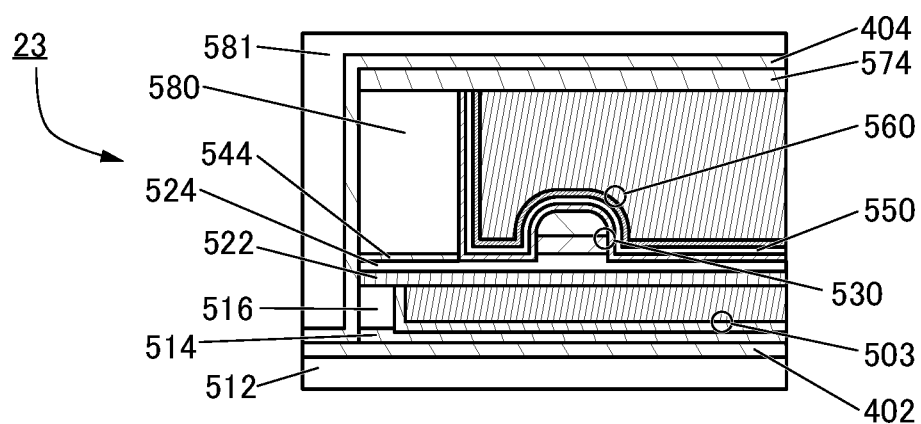

FIG. 12A and FIG. 12B show a modification example of the transistor 23 shown in FIG. 11A and FIG. 11B. FIG. 12A is a cross-sectional view of the transistor 23 in the channel length direction, and FIG. 12B is a cross-sectional view of the transistor 23 in the channel width direction. The structure shown in FIG. 12A and FIG. 12B can also be used for other transistors such as the transistor 23 included in the semiconductor device of one embodiment of the present invention.

The transistor 23 shown in FIG. 12A and FIG. 12B is different from the transistor 23 shown in FIG. 11A and FIG. 11B in that the insulator 402 and the insulator 404 are included. Furthermore, the transistor 23 shown in FIG. 12A and FIG. 12B is different from the transistor 23 shown in FIG. 11A and FIG. 11B in that the insulator 552 is provided in contact with a side surface of the conductor 540a and a side surface of the conductor 540b. Moreover, the transistor 23 shown in FIG. 12A and FIG. 12B is different from the transistor 23 shown in FIG. 11A and FIG. 11B in that the insulator 520 is not included.

In the transistor 23 shown in FIG. 12A and FIG. 12B, the insulator 402 is provided over the insulator 512. The insulator 404 is provided over the insulator 574 and the insulator 402.

In the structure of the transistor 23 shown in FIG. 12A and FIG. 12B, the insulator 514, the insulator 516, the insulator 522, the insulator 524, the insulator 544, the insulator 580, and the insulator 574 are patterned and covered with the insulator 404. That is, the insulator 404 is in contact with the top surface of the insulator 574, the side surface of the insulator 574, the side surface of the insulator 580, the side surface of the insulator 544, the side surface of the insulator 524, the side surface of the insulator 522, the side surface of the insulator 516, the side surface of the insulator 514, and the top surface of the insulator 402. Thus, the oxide 530 and the like are isolated from the outside by the insulator 404 and the insulator 402.

It is preferable that the insulator 402 and the insulator 404 have higher capability of inhibiting diffusion of hydrogen (e.g., at least one of a hydrogen atom, a hydrogen molecule, and the like) or a water molecule. For example, the insulator 402 and the insulator 404 are preferably formed using silicon nitride or silicon nitride oxide that is a material having a high hydrogen barrier property. This can inhibit diffusion of hydrogen or the like into the oxide 530, thereby suppressing the degradation of the characteristics of the transistor 23. Consequently, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, as the insulator 552, an insulator such as silicon nitride, aluminum oxide, or silicon nitride oxide that is a material having a high hydrogen barrier property is preferably used. In particular, silicon nitride is suitably used for the insulator 552 because of its high hydrogen barrier property. The use of a material having a high hydrogen barrier property for the insulator 552 can inhibit diffusion of impurities such as water or hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. As described above, the reliability of the semiconductor device of one embodiment of the present invention can be increased.

Figure 13A:
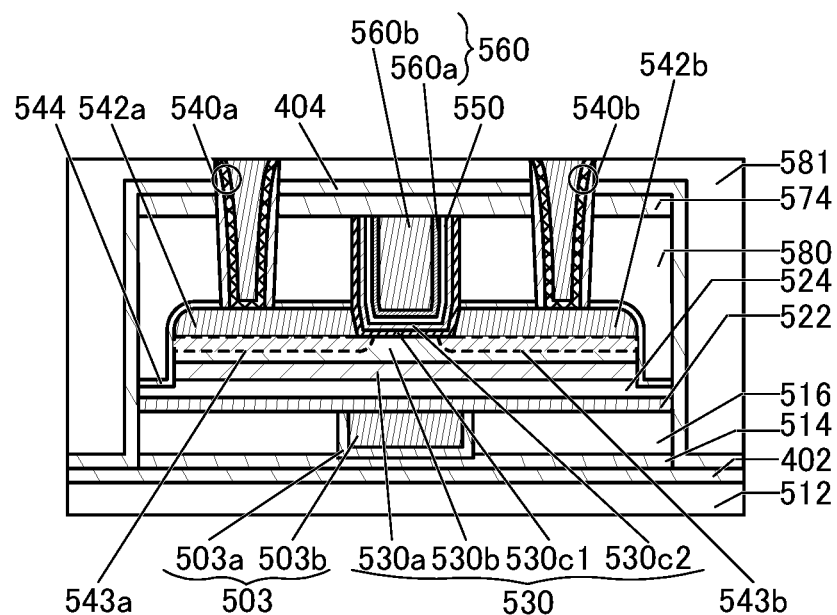
FIG. 13A and FIG. 13B are schematic cross-sectional views illustrating one embodiment of the present invention.
Figure 13B:
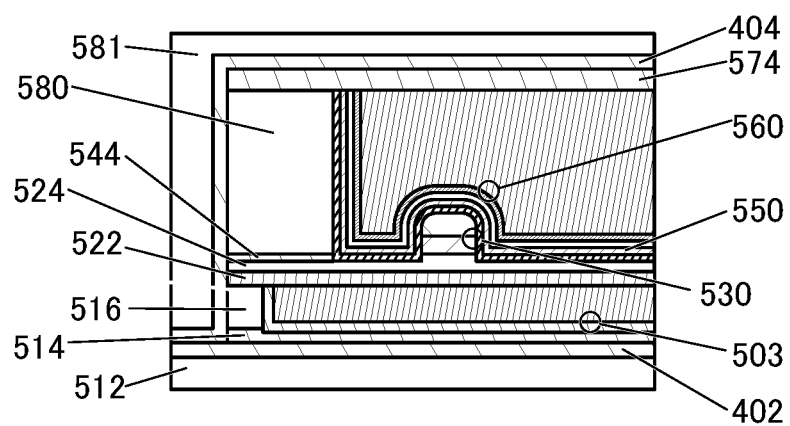

FIG. 13A and FIG. 13B illustrate a modification example of the transistor shown in FIG. 12A and FIG. 12B. FIG. 13A is a cross-sectional view of the transistor in the channel length direction, and FIG. 13B is a cross-sectional view of the transistor in the channel width direction. The transistor shown in FIG. 13A and FIG. 13B is different from the transistor shown in FIG. 12A and FIG. 12B in that the oxide 530c has a two-layer structure of an oxide 530c1 and an oxide 530c2.

The oxide 530c1 is in contact with the top surface of the insulator 524, the side surface of the oxide 530a, the top surface and the side surface of the oxide 530b, the side surfaces of the conductor 542a and the conductor 542b, the side surface of the insulator 544, and the side surface of the insulator 580. The oxide 530c2 is in contact with the insulator 550.

An In—Zn oxide can be used as the oxide 530c1, for example. As the oxide 530c2, it is possible to use a material similar to a material that can be used for the oxide 530c when the oxide 530c has a single-layer structure. As the oxide 530c2, a metal oxide with n:Ga:Zn=1:3:4 [atomic ratio], Ga:Zn=2:1 [atomic ratio], or Ga:Zn=2:5 [atomic ratio] can be used, for example.

When the oxide 530c has a two-layer structure of the oxide 530c1 and the oxide 530c2, the on-state current of the transistor can be increased as compared with the case where the oxide 530c has a single-layer structure. Thus, a transistor can be a power MOS transistor, for example. Note that the oxide 530c included in the transistor shown in FIG. 11A and FIG. 11B can also have a two-layer structure of the oxide 530c1 and the oxide 530c2.

When the transistor shown in FIG. 13A and FIG. 13B is used as the transistor 23, for example, the on-state current of the transistor 23 can be increased.

This embodiment can be implemented in an appropriate combination with the structures described in the other embodiments and the like.

Embodiment 3

In this embodiment, the compositions of a CAC-OS and a CAAC-OS, which are metal oxides that can be used in the OS transistor described in the above embodiments, will be described. Note that in this specification and the like, the CAC refers to an example of a function or a material composition, and the CAAC refers to an example of a crystal structure.

<Composition of Metal Oxide>

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. In some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different band gaps. For example, the CAC-OS or the CAC-metal oxide includes a component having a wide gap due to the insulating region and a component having a narrow gap due to the conductive region. When carriers flow in this composition, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel region of a transistor, high current drive capability in the on state of the transistor, that is, a high on-state current and high field-effect mobility can be obtained.

In other words, the CAC-OS or the CAC-metal oxide can also be referred to as a matrix composite or a metal matrix composite.

<Structure of Metal Oxide>

Oxide semiconductors are classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited by the distortion of lattice arrangement. This is probably because the CAAC-OS can tolerate distortion owing to the low density of oxygen atom arrangement in the a-b plane direction, a change in interatomic bond distance by replacement of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. When indium in the In layer is replaced with the element M, the layer can be referred to as an (In,M) layer.

The CAAC-OS is an oxide semiconductor with high crystallinity. Meanwhile, in the CAAC-OS, a reduction in electron mobility due to a crystal grain boundary is less likely to occur because a clear crystal grain boundary cannot be observed. Entry of impurities, formation of defects, or the like might decrease the crystallinity of the oxide semiconductor; thus, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

The a-like OS is an oxide semiconductor that has a structure between those of the nc-OS and the amorphous oxide semiconductor. The a-like OS contains a void or a low-density region. That is, the a-like OS has low crystallinity as compared with the nc-OS and the CAAC-OS.

An oxide semiconductor has various structures with different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for a transistor. In the case where the carrier concentration of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to stabilize the electrical characteristics of the transistor, reducing the impurity concentration in the oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2 \times 10^{18}$ atoms/$cm^3$, preferably lower than or equal to $2 \times 10^{17}$ atoms/$cm^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Accordingly, it is preferable to reduce the concentration of an alkali metal or an alkaline earth metal in the oxide semiconductor. Specifically, the concentration of an alkali metal or an alkaline earth metal in the oxide semiconductor that is obtained by SIMS is set lower than or equal to $1 \times 10^{18}$ atoms/$cm^3$, preferably lower than or equal to $2 \times 10^{16}$ atoms/$cm^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. Hence, nitrogen in the oxide semiconductor is preferably reduced as much as possible; the nitrogen concentration in the oxide semiconductor that is obtained by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor that is obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

This embodiment can be implemented in an appropriate combination with the structures described in the other embodiments and the like.

Embodiment 4

Figure 14:
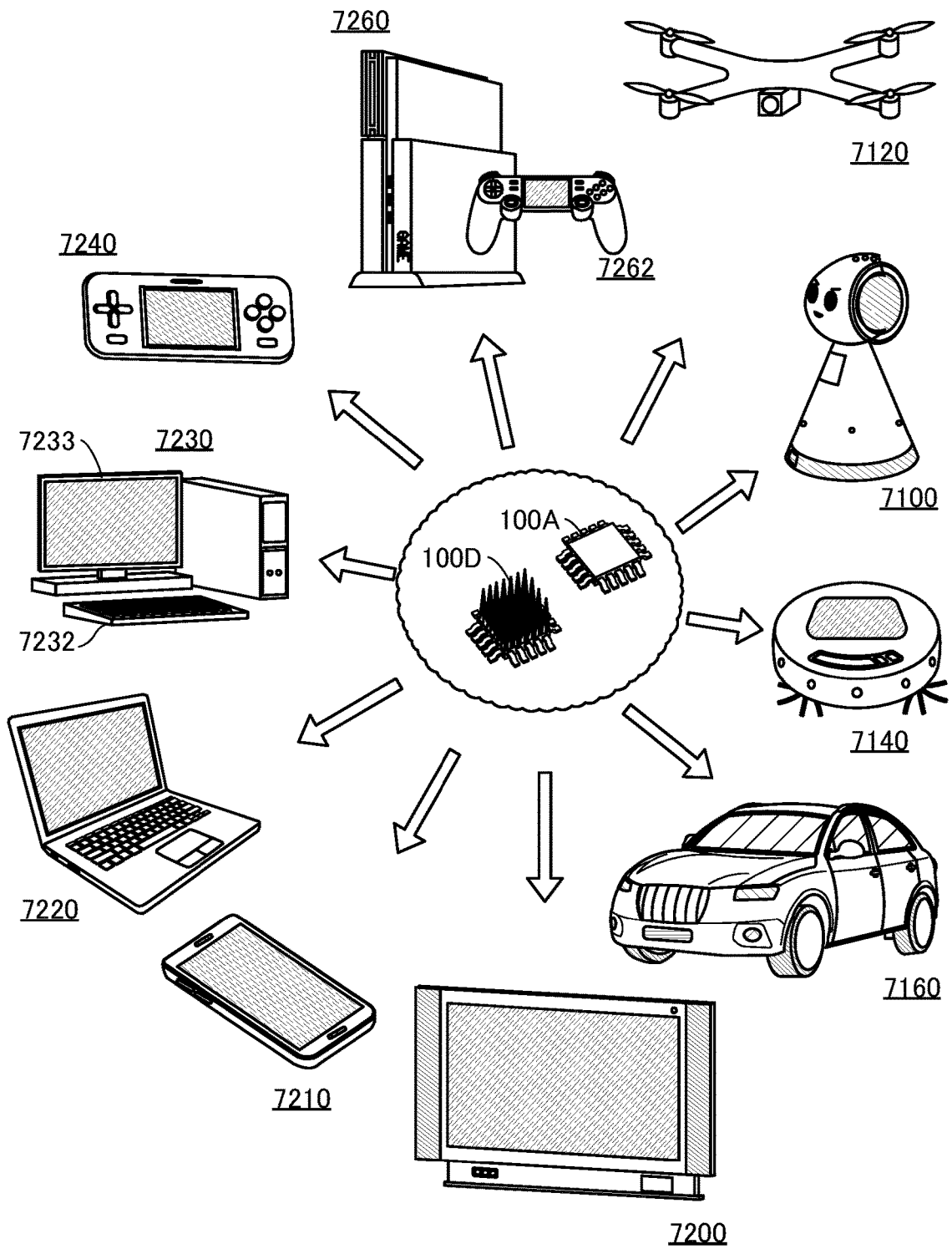
FIG. 14 is a diagram illustrating electronic devices.

In this embodiment, examples of electronic devices in which the semiconductor device or the like described in the above embodiment is incorporated are described with reference to FIG. 14.

A robot 7100 includes an illuminance sensor, a microphone, a camera, a speaker, a display, various kinds of sensors (e.g., an infrared ray sensor, an ultrasonic wave sensor, an acceleration sensor, a piezoelectric sensor, an optical sensor, and a gyro sensor), a moving mechanism, and the like. The electronic component 100A or 100D functions as a switch that controls power supply for driving these peripheral devices.

The microphone has a function of detecting acoustic signals of a speaking voice of a user, an environmental sound, and the like. The speaker has a function of outputting audio signals such as a voice and a warning beep. The robot 7100 can analyze an audio signal input via the microphone and can output a necessary audio signal from the speaker. The robot 7100 can communicate with the user with the use of the microphone and the speaker.

The camera has a function of taking images of the surroundings of the robot 7100. The robot 7100 has a function of moving with use of the moving mechanism. The robot 7100 can take images of the surroundings with use of the camera and analyze the images to sense whether there is an obstacle in the way of the movement.

A flying object 7120 includes propellers, a camera, a battery, and the like and has a function of flying autonomously. The electronic component 100A or 100D functions as a switch that controls power supply for driving these peripheral devices.

A cleaning robot 7140 includes a display provided on the top surface, a plurality of cameras provided on the side surface, a brush, an operation button, various kinds of sensors, and the like. The electronic component 100A or 100D functions as a switch that controls power supply for driving these peripheral devices. Although not illustrated, the cleaning robot 7140 is provided with a tire, an inlet, and the like. The cleaning robot 7140 can run autonomously, detect dust, and vacuum the dust through the inlet provided on the bottom surface.

An automobile 7160 includes an engine, tires, a brake, a steering gear, a camera, and the like. The electronic component 100A or 100D functions as a switch that controls power supply for driving these peripheral devices.

The electronic component 100A or 100D can be incorporated in a TV device 7200 (a television receiver), a smartphone 7210, PCs (personal computers) 7220 and 7230, a game machine 7240, a game machine 7260, and the like.

For example, the electronic component 100A or 100D incorporated in the TV device 7200 functions as a switch that controls power supply for driving the TV device 7200.

The smartphone 7210 is an example of a portable information terminal. The smartphone 7210 includes a microphone, a camera, a speaker, various kinds of sensors, and a display portion. The electronic component 100A or 100D functions as a switch that controls power supply for driving these peripheral devices.

The PC 7220 and the PC 7230 are examples of a laptop PC and a desktop PC. To the PC 7230, a keyboard 7232 and a monitor device 7233 can be connected with or without a wire. The game machine 7240 is an example of a portable game machine. The game machine 7260 is an example of a stationary game machine. To the game machine 7260, a controller 7262 is connected with or without a wire. The electronic component 100A or 100D functions as a switch that controls power supply for driving each component.

This embodiment can be implemented in combination with any of the structures described in the other embodiments and the like, as appropriate.

(Notes on Description of this Specification and the Like)

The description of the above embodiments and each structure in the embodiments are noted below.

One embodiment of the present invention can be constituted by combining, as appropriate, the structure described in each embodiment with any of the structures described in the other embodiments and Examples. In addition, in the case where a plurality of structure examples are described in one embodiment, the structure examples can be combined as appropriate.

Note that content (or may be part of the content) described in one embodiment can be applied to, combined with, or replaced with another content (or may be part of the content) described in the embodiment and/or content (or may be part of the content) described in another embodiment or other embodiments.

Note that in each embodiment, content described in the embodiment is content described using a variety of diagrams or content described with text disclosed in the specification.

Note that by combining a diagram (or may be part thereof) described in one embodiment with another part of the diagram, a different diagram (or may be part thereof) described in the embodiment, and/or a diagram (or may be part thereof) described in another embodiment or other embodiments, much more diagrams can be formed.

In addition, in this specification and the like, components are classified on the basis of the functions, and shown as blocks independent of one another in block diagrams. However, in an actual circuit or the like, it is difficult to separate components on the basis of the functions, and there are such a case where one circuit is associated with a plurality of functions and a case where a plurality of circuits are associated with one function. Therefore, blocks in the block diagrams are not limited by the components described in the specification, and the description can be changed appropriately depending on the situation.

Furthermore, in the drawings, the size, the layer thickness, or the region is shown with given magnitude for description convenience. Therefore, the size, the layer thickness, or the region is not necessarily limited to the illustrated scale. Note that the drawings are schematically shown for clarity, and embodiments of the present invention are not limited to shapes, values or the like shown in the drawings. For example, fluctuation in signal, voltage, or current due to noise, fluctuation in signal, voltage, or current due to difference in timing, or the like can be included.

Furthermore, the positional relation between components illustrated in the drawings and the like is relative. Therefore, when the components are described with reference to drawings, terms for describing the positional relation, such as "over" and "under", may be used for convenience. The positional relation of the components is not limited to that described in this specification and can be explained with other terms as appropriate depending on the situation.

In this specification and the like, expressions "one of a source and a drain" (or a first electrode or a first terminal) and "the other of the source and the drain" (or a second electrode or a second terminal) for the other of the source and the drain are used in the description of the connection relationship of a transistor. This is because the source and the drain of the transistor change depending on the structure, operating conditions, or the like of the transistor. Note that the source or the drain of the transistor can also be referred to as a source (drain) terminal, a source (drain) electrode, or the like as appropriate depending on the situation.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

Furthermore, in this specification and the like, "voltage" and "potential" can be interchanged with each other as appropriate. The voltage refers to a potential difference from a reference potential, and when the reference potential is a ground voltage, for example, the voltage can be rephrased into the potential. The ground potential does not necessarily mean 0 V. Note that potentials are relative values, and a potential applied to a wiring or the like is sometimes changed depending on the reference potential.

In this specification and the like, a node can be referred to as a terminal, a wiring, an electrode, a conductive layer, a conductor, an impurity region, or the like depending on the circuit structure, the device structure, or the like. Furthermore, a terminal, a wiring, or the like can be referred to as a node.

In this specification and the like, the expression "A and B are connected" means the case where A and B are electrically connected. Here, the expression "A and B are electrically connected" means connection that enables electric signal transmission between A and B in the case where an object (that refers to an element such as a switch, a transistor element, or a diode, a circuit including the element and a wiring, or the like) exists between A and B. Note that the case where A and B are electrically connected includes the case where A and B are directly connected. Here, the expression "A and B are directly connected" means connection that enables electric signal transmission between A and B through a wiring (or an electrode) or the like, not through the above object. In other words, direct connection refers to connection that can be regarded as the same circuit diagram when indicated as an equivalent circuit.

In this specification and the like, a switch has a function of controlling whether current flows or not by being in a conduction state (an on state) or a non-conduction state (an off state). Alternatively, a switch has a function of selecting and changing a current path.

In this specification and the like, channel length refers to, for example, the distance between a source and a drain in a region where a semiconductor (or a portion where current flows in a semiconductor when a transistor is in an on state) and a gate overlap with each other or a region where a channel is formed in a top view of the transistor.

In this specification and the like, channel width refers to, for example, the length of a portion where a source and a drain face each other in a region where a semiconductor (or a portion where current flows in a semiconductor when a transistor is in an on state) and a gate electrode overlap with each other or a region where a channel is formed.

Note that in this specification and the like, the terms such as "film" and "layer" can be interchanged with each other depending on the case or according to circumstances. For example, the term "conductive layer" can be changed into the term "conductive film" in some cases. As another example, the term "insulating film" can be changed into the term "insulating layer" in some cases.

REFERENCE NUMERALS

10: semiconductor device, 10A: semiconductor device, 10B: semiconductor device, 10C: semiconductor device, 10D: semiconductor device, 10E: semiconductor device, 11: device, 11A: device, 11B: device, 11C: device, 11D: device, 12: silicon substrate, 20: semiconductor device, 21A: conductor, 21B: conductor, 22A: conductor, 22B: conductor, 23: transistor, 23B: transistor, 23B_1: transistor, 23B_2: transistor, 23C: transistor, 23D: transistor, 23R: region, 24A: opening, 24B: opening, 25: transistor, 25A: oxide layer, 25B: oxide layer, 26: transistor, 26A: gate electrode, 26B: gate electrode, 26B_1: conductor, 26B_2: conductor, 27A: region, 27B: region, 28: oxide layer, 29: conductor, 30: electrode layer, 31A: conductor, 31B: conductor, 51A: region, 51B: region, 60: battery protection circuit, 61: battery, 100A: electronic component, 100B: electronic component, 100C: electronic component, 100D: electronic component, 101: substrate, 102: adhesive layer, 103: resin layer, 104A: metal wiring, 104B: metal wiring, 105A: electrode, 105B: electrode, 106: housing, 107: heat sink, 199: power storage device, 320: insulator, 322: insulator, 324: insulator, 326: insulator, 328: conductor, 330: conductor, 350: insulator, 352: insulator, 354: insulator, 356: conductor, 402: insulator, 404: insulator, 503: conductor, 503a: conductor, 503b: conductor, 510: insulator, 512: insulator, 514: insulator, 516: insulator, 518: conductor, 520: insulator, 522: insulator, 524: insulator, 530: oxide, 530a: oxide, 530b: oxide, 530c: oxide, 530c1: oxide, 530c2: oxide, 540a: conductor, 540b: conductor, 542: conductor, 542a: conductor, 542b: conductor, 543a: region, 543b: region, 544: insulator, 546: conductor, 548: conductor, 550: insulator, 552: insulator, 560: conductor, 560a: conductor, 560b: conductor, 574: insulator, 580: insulator, 581: insulator, 582: insulator, 586: insulator, 610: conductor, 612: conductor, 7100: robot, 7120: flying object, 7140: cleaning robot, 7160: automobile, 7200: TV device, 7210: smartphone, 7220: PC, 7330: PC, 7232: keyboard, 7233: monitor device, 7240: game machine, 7260: game machine, 7262: controller

The invention claimed is:

1. A semiconductor device comprising:
a silicon substrate without a transistor; and
a device provided above the silicon substrate,
wherein the device comprises a transistor and a first conductor,
wherein the transistor comprises a metal oxide in a channel formation region,
wherein conductivity is imparted to the silicon substrate,
wherein the first conductor is electrically connected to each of a drain of the transistor and the silicon substrate through openings provided in the device, and
wherein the first conductor is in contact with a top surface of the silicon substrate.

2. The semiconductor device according to claim 1,
wherein p-type conductivity is imparted to the silicon substrate.

3. The semiconductor device according to claim 1,
wherein the silicon substrate and the device are covered with a resin layer, and
wherein the resin layer is provided in a housing.

4. The semiconductor device according to claim 1,
wherein the silicon substrate is provided with a heat sink with an insulating layer therebetween.

5. A semiconductor device comprising:
a silicon substrate without a transistor;
a device provided above the silicon substrate;
a first extraction electrode; and
a second extraction electrode,
wherein the device comprises a transistor and a first conductor,
wherein the transistor comprises a metal oxide in a channel formation region,
wherein conductivity is imparted to the silicon substrate,
wherein the first conductor is electrically connected to each of a drain of the transistor and the silicon substrate through openings provided in the device,
wherein the first conductor is in contact with a top surface of the silicon substrate,
wherein the first extraction electrode is electrically connected to a second conductor connected to a source of the transistor, and
wherein the second extraction electrode is electrically connected to the silicon substrate.

6. The semiconductor device according to claim 5,
wherein the first extraction electrode is electrically connected to, through a metal wiring, the second conductor.

7. The semiconductor device according to claim 5,
wherein the second extraction electrode is directly connected to the silicon substrate.

8. The semiconductor device according to claim 5,
wherein p-type conductivity is imparted to the silicon substrate.

9. The semiconductor device according to claim 5,
wherein the silicon substrate and the device are covered with a resin layer, and
wherein the resin layer is provided in a housing.

10. The semiconductor device according to claim 5,
wherein the silicon substrate is provided with a heat sink with an insulating layer therebetween.

* * * * *